United States Patent
Howald et al.

(10) Patent No.: US 9,720,022 B2
(45) Date of Patent: Aug. 1, 2017

(54) SYSTEMS AND METHODS FOR PROVIDING CHARACTERISTICS OF AN IMPEDANCE MATCHING MODEL FOR USE WITH MATCHING NETWORKS

(71) Applicant: Lam Research Corporation, Fremont, CA (US)

(72) Inventors: Arthur M. Howald, Livermore, CA (US); Bradford J. Lyndaker, San Ramon, CA (US); John C. Valcore, Jr., Fremont, CA (US); Seyed Jafar Jafarian-Tehrani, Fremont, CA (US)

(73) Assignee: Lam Research Corporation, Fremont, CA (US)

(*) Notice: Subject to any disclaimer, the term of this patent is extended or adjusted under 35 U.S.C. 154(b) by 135 days.

(21) Appl. No.: 14/716,797

(22) Filed: May 19, 2015

(65) Prior Publication Data
US 2016/0343548 A1    Nov. 24, 2016

(51) Int. Cl.
*G01R 27/02* (2006.01)
*H01J 37/32* (2006.01)

(52) U.S. Cl.
CPC ........ *G01R 27/02* (2013.01); *H01J 37/32183* (2013.01); *H01J 37/32926* (2013.01); *H01J 37/32935* (2013.01)

(58) Field of Classification Search
CPC ........... H01J 37/32917; H01J 37/32935; H01J 37/32926; H01J 37/32183; G01R 27/02
See application file for complete search history.

(56) References Cited

U.S. PATENT DOCUMENTS

| | | | |
|---|---|---|---|
| 3,569,777 A | 3/1971 | Beaudry | |
| 4,755,345 A | 7/1988 | Baity, Jr. et al. | |
| 5,187,454 A * | 2/1993 | Collins | H03H 11/30 333/17.3 |
| 5,541,482 A | 7/1996 | Siao | |
| 5,689,215 A | 11/1997 | Richardson et al. | |
| 6,136,388 A | 10/2000 | Raoux et al. | |
| 6,252,354 B1 | 6/2001 | Collins et al. | |
| 6,528,751 B1 | 3/2003 | Hoffman et al. | |
| 6,781,317 B1 * | 8/2004 | Goodman | H01J 37/32935 315/111.21 |
| 6,818,562 B2 | 11/2004 | Todorow et al. | |
| 6,838,635 B2 | 1/2005 | Hoffman et al. | |

(Continued)

FOREIGN PATENT DOCUMENTS

| | | |
|---|---|---|
| EP | 0552955 A1 | 1/1993 |
| EP | 0840350 A2 | 5/1998 |

(Continued)

*Primary Examiner* — Patrick Assouad
*Assistant Examiner* — Haidong Zhang
(74) *Attorney, Agent, or Firm* — Martine Penilla Group, LLP

(57) ABSTRACT

Systems and methods for generating and using characteristics of an impedance matching model with different impedance matching networks are described impedances and/or power efficiencies are measured using a network analyzer or a sensor. The impedances and/or power efficiencies are used to determine the characteristics. With use of different impedance matching networks, the values of the characteristics are changed to achieve same or similar results across different plasma tools for a variety of conditions.

25 Claims, 17 Drawing Sheets

(56) References Cited

U.S. PATENT DOCUMENTS

| | | |
|---|---|---|
| 6,838,832 B1 | 1/2005 | Howald et al. |
| 6,887,339 B1 | 5/2005 | Goodman et al. |
| 7,019,543 B2 | 3/2006 | Quon |
| 7,132,996 B2 | 11/2006 | Evans et al. |
| 7,215,697 B2 | 5/2007 | Hill |
| 7,253,699 B2 | 8/2007 | Schaffner et al. |
| 7,489,718 B2 | 2/2009 | Hill |
| 7,554,334 B2 | 6/2009 | Shannon et al. |
| 7,570,131 B2 | 8/2009 | Sangawa |
| 7,573,352 B2 | 8/2009 | Sangawa |
| 7,579,924 B2 | 8/2009 | Sangawa |
| 7,646,205 B2 | 1/2010 | Berlin |
| 8,436,643 B2 | 5/2013 | Mason |
| 8,968,297 B2 | 3/2015 | Collins |
| 2003/0215373 A1* | 11/2003 | Reyzelman ....... H01J 37/32082 422/186.29 |
| 2005/0069011 A1 | 3/2005 | Hill |
| 2006/0005928 A1* | 1/2006 | Howald ............ H01J 37/32082 156/345.48 |
| 2007/0251920 A1 | 11/2007 | Hoffman |
| 2007/0262723 A1* | 11/2007 | Ikenouchi ......... H01J 37/32174 315/111.21 |
| 2014/0172335 A1 | 6/2014 | Valcore, Jr. et al. |
| 2014/0195033 A1 | 7/2014 | Lyndaker et al. |
| 2014/0302256 A1 | 10/2014 | Chen et al. |
| 2015/0032245 A1 | 1/2015 | Valcore, Jr. et al. |
| 2015/0069912 A1 | 3/2015 | Valcore, Jr. et al. |

FOREIGN PATENT DOCUMENTS

| | | |
|---|---|---|
| EP | 0877482 A1 | 11/1998 |
| EP | 2675064 A1 | 12/2013 |

* cited by examiner (3 measurements: real portion of S11, imaginary portion of S11, and S21, etc.)

SYSTEMS AND METHODS FOR PROVIDING CHARACTERISTICS OF AN IMPEDANCE MATCHING MODEL FOR USE WITH MATCHING NETWORKS

FIELD

The present embodiments relate to systems and methods for providing characteristics of an impedance matching model for use with matching networks.

BACKGROUND

Plasma systems are used to control plasma processes. A plasma system includes multiple radio frequency (RF) sources, an impedance match, and a plasma reactor. A workpiece is placed inside the plasma chamber and plasma is generated within the plasma chamber to process the workpiece. It is important that the workpiece be processed in a similar or uniform manner independent of replacement or use of one part of the plasma system with another. For example, when a part of the plasma system is replaced with another part, the workpiece is processed differently.

It is in this context that embodiments described in the present disclosure arise.

SUMMARY

Embodiments of the disclosure provide apparatus, methods and computer programs for providing characteristics of an impedance matching model for use with matching networks. It should be appreciated that the present embodiments can be implemented in numerous ways, e.g., a process, an apparatus, a system, a piece of hardware, or a method on a computer-readable medium. Several embodiments are described below.

In one embodiment, a method includes receiving a reference impedance, which is measured for a frequency operating range of a sensor and for a position range associated with one or more reference variable capacitors within a reference impedance matching network coupled to a load. The load has an impedance. The method further includes accessing an impedance matching model. The load impedance is applied at an output of the impedance matching model. The method further includes generating a set of reference characteristics of pre-determined elements of the impedance matching model to achieve the reference impedance at an input of the impedance matching model. The method includes receiving a test impedance, which is measured for the frequency operating range of the sensor and for the position range associated with one or more test variable capacitors within a test impedance matching network coupled to the load. The reference impedance matching network has a same arrangement of components as that of the test impedance matching network. When the load impedance is applied at the output of the impedance matching model, the method includes generating a set of test characteristics of the pre-determined elements of the impedance matching model to achieve the test impedance at the input of the impedance matching model. The method includes applying in a plasma tool having the test impedance matching network the set of test characteristics to the impedance matching model to calculate one or more values of one or more parameters at the output of the impedance matching model.

In an embodiment, a method includes receiving a reference impedance, which is measured for a frequency operating range of a sensor and for a position range associated with one or more reference variable capacitors within a reference impedance matching network coupled to a load. The load has an output. The output of the load is coupled to a resistor. The load and the resistor have a combined impedance. The method further includes accessing an impedance matching model. When the combined impedance is applied at an output of the impedance matching model, the method includes generating a set of reference characteristics of pre-determined elements of the impedance matching model to achieve the reference impedance at an input of the impedance matching model. The method further includes receiving a test impedance, which is measured for the frequency operating range of the sensor and for the position range associated with one or more test variable capacitors within a test impedance matching network coupled to the load. The reference impedance matching network has a same arrangement of circuit components as that of the test impedance matching network. When the combined impedance is applied at the output of the impedance matching model, the method includes generating a set of test characteristics of the pre-determined elements of the impedance matching model to achieve the test impedance at the input of the impedance matching model. The method includes applying in a plasma tool the set of test characteristics to the impedance matching model to calculate one or more values of one or more parameters at the output of the impedance matching model.

In one embodiment, a method includes receiving a reference efficiency, which is measured for a frequency operating range of a network analyzer and for a position range associated with one or more reference variable capacitors within a reference impedance matching network coupled to a load. The load has an efficiency. The reference efficiency is calculated from the efficiency of the load. The method further includes accessing an impedance matching model. The method includes generating a set of reference characteristics of pre-determined elements of the impedance matching model to achieve the reference efficiency. The method also includes receiving a test efficiency, which is measured for the frequency operating range of the sensor and for the position range associated with one or more test variable capacitors within a test impedance matching network coupled to the load. The reference impedance matching network has a same arrangement of circuit components as that of the test impedance matching network. The method includes generating a set of test characteristics of the pre-determined elements of the impedance matching model to achieve the test efficiency. The method includes applying in a plasma tool the set of test characteristics to the impedance matching model to calculate one or more values of one or more parameters at the output of the impedance matching model.

Some advantages of some of the above-described embodiments include calculating characteristics of pre-determined elements of an impedance matching model for one condition, e.g., pressure, temperature, etc., and using the characteristics for different impedance matching networks to achieve same or similar processing results. The condition is implemented using a load. For example, the load is insensitive to pressure or temperature or wear and tear. The characteristics are calculated for different impedance matching networks. For example, an impedance matching network 1 is connected to the load to facilitate calculation of characteristics a1 and b1 and then another impedance matching network 2 is connected to the load to facilitate calculation of characteristics a2 and b2. The same impedance matching model is used when one impedance matching network is replaced with a different impedance matching network in a plasma tool. For example, when an impedance matching network 1 is used in the plasma tool, the characteristics a1 and b1 are applied to the impedance matching model to generate variable at an output of the impedance matching model and when an impedance matching network 2 is used in the plasma tool, the characteristics a2 and b2 are applied to the impedance matching model to generate variable at the output of the impedance matching model. As such, the characteristics measured for the condition are applied when the different impedance matching networks are used and the plasma chamber is operated in a variety of conditions, e.g., pressure, temperature, gap, power, etc. The characteristics facilitate achieving the same or similar results, e.g., similar or same values of voltage or current is provided as output of the impedance matching model when the impedance matching model is used for the different impedance matching networks.

Yet additional advantages include reducing time to tune the impedance matching model when the different impedance matching networks are used. When the characteristics are pre-calculated, e.g., before processing a wafer, etc., before changing impedance matching networks, etc., the characteristics are changed with a change in the impedance matching networks. Such instant change in the characteristics saves time in tuning the characteristics after one impedance matching network is replaced with another impedance matching network.

Other advantages of the above-described embodiments include using the insensitive load, e.g., a load M or a load N, etc., that operates closer to an edge of a Smith chart than to an edge of the Smith chart to generate impedance and/or power efficiency values that are located close to a center of a Smith chart. For example, instead of using a resistor of 50 ohm as a load, the load M or load N is used. When an RF signal is provided to the load M or load N, an impedance or a power efficiency measured by a network analyzer is closer to a center of a Smith chart than to an edge of the Smith chart.

Other aspects will become apparent from the following detailed description, taken in conjunction with the accompanying drawings.

BRIEF DESCRIPTION OF THE DRAWINGS

The embodiments are understood by reference to the following description taken in conjunction with the accompanying drawings.

DETAILED DESCRIPTION

The following embodiments describe systems and methods for providing characteristics of an impedance matching model for use with matching networks. It will be apparent that the present embodiments may be practiced without some or all of these specific details. In other instances, well known process operations have not been described in detail in order not to unnecessarily obscure the present embodiments.

Figure 1A:
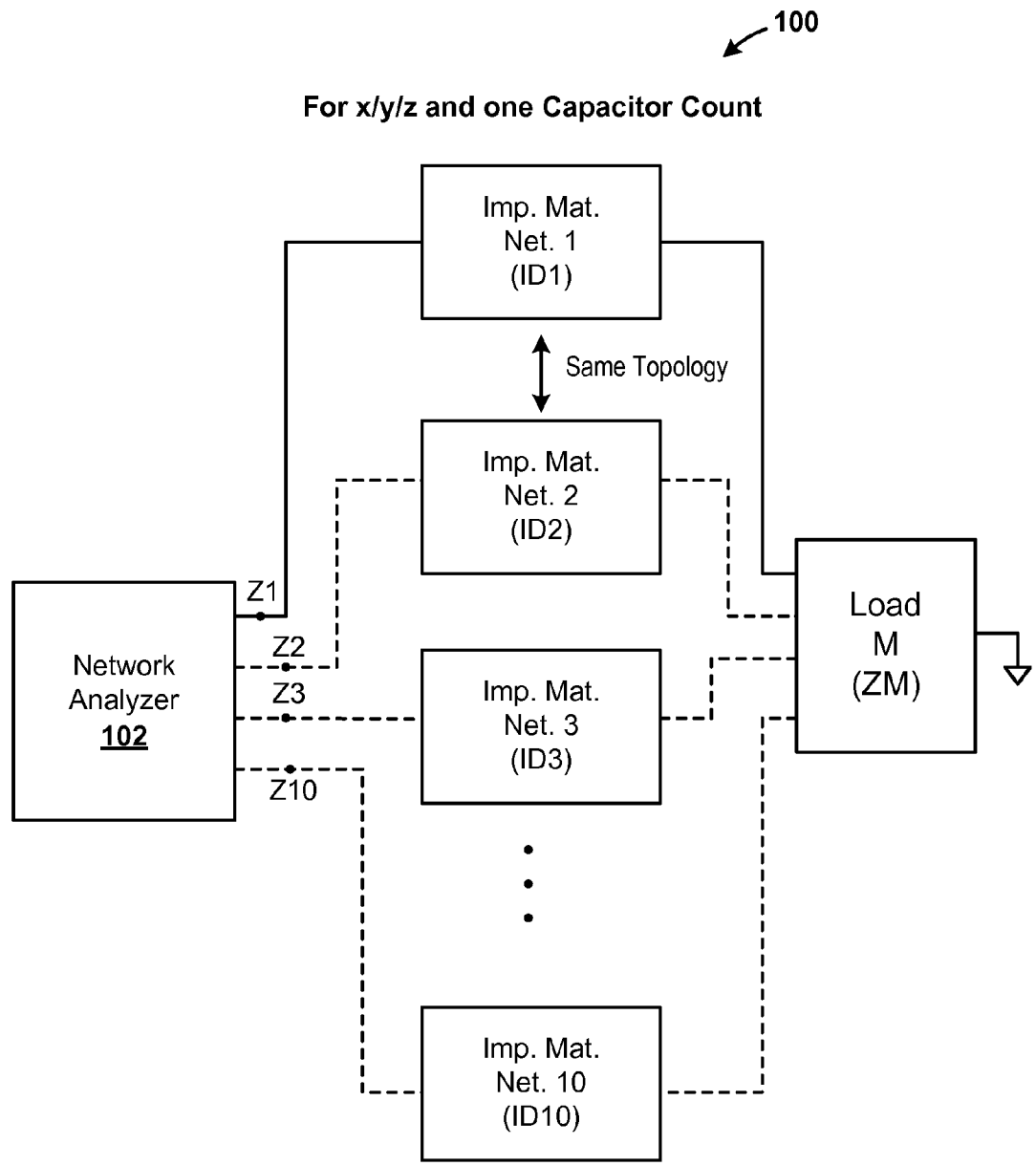
FIG. 1A is a diagram of an embodiment of a system for measuring impedances for different impedance matching networks.

FIG. 1A is a diagram of an embodiment of a system 100 for measuring impedances Z1, Z2, Z3, thru Z10 at inputs of different impedance matching networks (IMNs) 1, 2, 3, thru 10. The system 100 includes a network analyzer 102, the impedance matching networks 1 thru 10, and a load M.

In one embodiment, the network analyzer 102 includes a signal generator, a test set, one or more sensors, and a display.

In an embodiment, the load M has an inductance, or a capacitance, or a resistance, or a combination of a resistance, inductance and capacitance. As an example, the load M is a metallic structure that has an inductance and a capacitance.

In one embodiment, the load M mimics an impedance of a plasma chamber and plasma within the plasma chamber. For example, when an impedance matching network is connected to the load M, the impedance matching network transforms an impedance, e.g., impedance of a plasma chamber and plasma, etc., which is typically not equal to 50 ohms, of the load M to a value approximately equal to 50 ohms.

In an embodiment, impedance of the load M has real and imaginary parts to mimic plasma that also has real and imaginary parts. For example, the real part of load M varies from as low as approximately 1 ohm up to as high as approximately 50 ohms.

The impedance matching network 1 is identified using an identification number (ID) 1, the impedance matching network 2 is identified using an ID2, the impedance matching network 3 is identified using an ID3, and so on. For example, the impedance matching network 10 is identified using an ID10. As an illustration, the impedance matching network 1 is assigned a serial number different from a serial number assigned to the impedance matching network 2. As another illustration, a serial number is on a housing of an impedance matching network.

In one embodiment, an identification number includes letters, numbers, symbols, or a combination of two or more of letters, numbers, and symbols.

The load M has an impedance ZM. For example, an impedance of the load is R+jX, where R is resistance of the load M, X is reactance of the load M, and j is a unit imaginary number. R is a real part, e.g., real portion, etc., of the load M and X is an imaginary part, e.g., imaginary portion, etc., of the load M. As another example, the impedance at the input of the load M is ZM. The load M is not sensitive to temperature changes, pressure changes, and to corrosion. For example, the load M has the same characteristics regardless of a temperature to which the load M is subjected to, a pressure to which the load M is subjected to, and passage of a pre-determined amount of time, e.g., aging of the load M, etc.

Each impedance matching network 1 thru 10 has the same topology. For example, the impedance matching network 1 has the same number of circuit components as that of the impedance matching network 2 and the impedance matching network 1 has the same arrangement of the circuit components as that of the impedance matching network 2. As an illustration, with reference to FIG. 7, an impedance matching network 700 is an example of each of the impedance matching networks 1 thru 10. As another illustration, with reference to FIG. 4A, each impedance matching network 1 thru 10 has an arrangement and the arrangement includes a portion having a topology 404. The topology 404 is of an impedance matching network portion 402, which has an input 407. The network analyzer 102 is connected to the input 407.

To further illustrate an arrangement of each of the impedance matching networks 1 thru 10, a circuit portion of each impedance matching network 1 thru 10 includes circuits M1, M2 and M3. The circuit M1 has an inductor L1 connected in series with a capacitor C1, which is further connected in series with a resistor R1. Also, the circuit M1 has an inductor L4 connected in series with a capacitor C4, which is further connected in series with a resistor R4. Furthermore, the circuit M2 has an inductor L2 connected in series with a capacitor C2, which is further connected in series with a resistor R2. Moreover, the circuit M2 has an inductor L5 connected in series with a capacitor C5, which is further connected in series with a resistor R5. The circuit M3 has an inductor L3 connected in series with a capacitor C3, which is further connected in series with a resistor R3. Also, the circuit M3 has an inductor L6 connected in series with a capacitor C6, which is further connected in series with a resistor R6. As yet another illustration, the circuit M1 is connected in series with the circuit M2, which is connected in series with the circuit M3. As another illustration, the circuit components L4, C4, and R4 act as a shunt circuit. Similarly, the circuit components L5, C5, and R5 act as a shunt circuit and the circuit components L6, C6, and R6 act as a shunt circuit.

In one embodiment, each circuit M1 thru M3 has a different number of resistors, or capacitors, or inductors than that shown. For example, the circuits M1 thru M3 exclude the resistors R4 thru R6, or exclude the capacitors C4 thru C6, or exclude the inductors L4 thru L6. As another example, the circuits M1 thru M3 exclude the resistors R1 thru R3.

With reference back to FIG. 1A, one or more characteristics exhibited by one or more circuit components of the impedance matching network 1 is different from one or more characteristics exhibited by one or more circuit components of the impedance matching network 2. Examples of a characteristic include a resistance, or a capacitance, or an inductance. Examples of a circuit component include a resistor, or a capacitor, or an inductor. To illustrate, a resistance encountered by an RF signal that passes through the resistor R1 of the impedance matching network 1 is different from a resistance encountered by an RF signal that passes through the resistor R1 of the impedance matching network 2 and/or a capacitance encountered by an RF signal that passes through the capacitor C1 of the impedance matching network 1 is different from a capacitance encountered by an RF signal that passes through the capacitor C1 of the impedance matching network 2 and/or an inductance encountered by an RF signal that passes through the inductor L1 of the impedance matching network 1 is different from an inductance encountered by an RF signal that passes through the inductor L1 of the impedance matching network 2.

Similarly, one or more characteristics exhibited by one or more circuit components of the impedance matching network 3 is different from one or more characteristics exhibited by one or more circuit components of the impedance matching network 2 and is different from one or more characteristics exhibited by one or more circuit components of the impedance matching network 1. In a similar manner, one or more characteristics exhibited by one or more circuit components of the impedance matching network 4 is different from one or more characteristics exhibited by one or more circuit components of the impedance matching network 3 and is different from one or more characteristics exhibited by one or more circuit components of the impedance matching network 2 and is different from one or more characteristics exhibited by one or more circuit components of the impedance matching network 1.

The impedance matching network 1 is connected to the network analyzer 102 and the load M. For example, an input, e.g., the input 407 (FIG. 4A), etc., of the impedance matching network 1 is connected to an S1 port of the network analyzer 102 and an S2 port of the network analyzer 102 is connected to ground. Moreover, in this example, an output, e.g., an output 409, etc., of the impedance matching network 1 is connected to an input of the load M. The network analyzer 102 generates a signal, e.g., a radio frequency (RF) signal having a magnitude of an order of milliwatts, etc., and a frequency f1 and supplies the signal via the impedance matching network 1 to the load M. The impedance matching network 1 matches an impedance of a load, e.g., the load M, etc., connected to the output of the impedance matching network 1 with that of a source, e.g., S1 port of the network analyzer 102, etc., connected to the input of the impedance matching network 1 to generate a modified RF signal. The modified RF signal is provided to the load M.

The network analyzer 102 measures and stores an impedance Z1 at the input of the impedance matching network 1. The impedance Z1 is a combined impedance of the impedance matching network 1 and the load M.

In an embodiment, the network analyzer 102 measures and records multiple impedance values, each value for a different frequency of an RF signal that is supplied by the network analyzer 102. The network analyzer 102 generates RF signals of different frequencies between a pre-determined high frequency limit, e.g., the frequency f1, etc., and a pre-determined low frequency limit, e.g., the frequency f2, etc.

The impedance matching network 1 is decoupled from the network analyzer 102 and the load M to allow the impedance matching network 2 to be coupled to the network analyzer 102 and the load M. For example, an input, e.g., the input 407 (FIG. 4A), etc., of the impedance matching network 2 is connected to the S1 port of the network analyzer 102 and an output, e.g., the output 409 (FIG. 4A), etc., of the impedance matching network 2 is connected to the input of the load M to which the impedance matching network 1 was coupled. Again, the network analyzer 102 generates a signal having the frequency f1 or having the frequency f2, and supplies the signal via the impedance matching network 2 to the load M. The frequency f2 is within a pre-determined range from the frequency f1. For example, both the frequencies f1 and f2 correspond to a 2 MHz RF signal, or a 27 MHz RF signal, or a 60 MHz RF signal. To illustrate, the frequency f1 is 2.1 MHz and the frequency f2 is 2.2 MHz. As another illustration, the frequency f1 is 26.9 MHz and the frequency f2 is 27 MHz. As yet another illustration, the frequency f1 is 400 kHz and the frequency f2 is 402 kHz. As another illustration, the frequencies f1 and f2 are within tens of kilohertz from each other. When the signal is supplied, an impedance Z2 at the input of the impedance matching network 2, is measured by the network analyzer 102.

Similarly, impedance Z3 thru Z10 at inputs of the impedance matching networks 3 thru 10 are measured by the network analyzer 102. For example, the impedance matching network 2 is decoupled from the network analyzer 102 and from the load M, and the impedance matching network 3 is connected to the network analyzer 102 and the load M for measuring the impedance Z3 of the impedance matching network 3.

It should be noted that one or more positions of one or more capacitors of the impedance matching network 1 is within a threshold of one or more positions of one or more corresponding capacitors of any of the impedance matching networks 2 thru 10. As an example, if each of the impedance matching networks 1 and 2 has one variable capacitor, the variable capacitor of the impedance matching network 2 is at a position within the threshold of a position of the variable capacitor of the impedance matching network 1. The threshold is referred to herein as a position threshold. Examples of a capacitor position includes a tap position, which is sometimes referred to as a shaft turn position. A tap position defines distance between parallel plates of a capacitor. With a change in a tap position, a distance between the plates increases or decreases. As another example, if each of the impedance matching networks 1 and 2 has a first variable capacitor and a second variable capacitor, the first variable capacitor of the impedance matching network 2 are at a position within the threshold of a position of the first variable capacitor of the impedance matching network 1 and the second variable capacitor of the impedance matching network 2 are at a position within the threshold of a position of the second variable capacitor of the impedance matching network 1.

In an embodiment, a variable capacitor of each of the impedance matching networks 1 thru 10 is set to a position within the position threshold and the impedances Z1 thru Z10 are measured by the network analyzer 102 at a frequency within the pre-determined range of frequencies. For example, the network analyzer 102 supplies an RF signal of the same RF frequency when connected to any one of the impedance matching networks 1 thru 10. As another example, the network analyzer 102 supplies an RF signal having a frequency within the pre-determined range of frequencies for which each of the impedances Z1 thru Z10 is measured to be closest to (50+0j) ohms when the network analyzer 102 is connected to a corresponding one of the impedance matching networks 1 thru 10.

In one embodiment, a position of a capacitor of one of the impedance matching networks 1 thru 10 is within a threshold of a position of a capacitor of one of remaining of the impedance matching networks 1 thru 10 when both the positions are the same. The capacitors of one of the impedance matching networks 1 thru 10 and one of the remaining of the impedance matching networks 1 thru 10 have the same positions within the one of the impedance matching networks and the one of the remaining of the impedance matching networks. For example, the capacitor C1 has the same position within the impedance matching network 1 as that of the capacitor C1 within the impedance matching network 2. To illustrate, the capacitor C1 of the impedance matching network 1 is connected in series with the inductor L1 and with the resistor R1 of the impedance matching network 1 and also is located within the circuit M1 of the impedance matching network 1. Moreover, in this illustration, the capacitor C1 of the impedance matching network 2 is connected in series with the inductor L1 and with the resistor R1 of the impedance matching network 2 and also is located within the circuit M1 of the impedance matching network 2.

It should be noted that although ten impedance matching networks are shown as being connected sequentially to the network analyzer 102 and the load M, in one embodiment, any other number of impedance matching networks, e.g., four impedance matching networks, six impedance matching networks, twelve impedance matching networks, etc., are connected sequentially to the network analyzer 102 and the load M to measure a number of impedances.

It should be noted that in one embodiment, instead of using the load M, a plasma chamber, which is further described below, is used as a load, and instead of using the network analyzer 102, an x/y/z RF generator and a sensor, e.g., an impedance sensor, etc., is used to measure the impedances Z1 thru Z10. It should be noted that the x/y/z RF generator is either an x MHz RF generator or a y MHz RF generator or a z MHz RF generator. An example of the x MHz RF generator includes a 2 megahertz (MHz) RF generator or a 400 kilohertz (kHz) RF generator. An example of the y MHz RF generator includes a 27 MHz RF generator. An example of the z MHz RF generator includes a 60 MHz RF generator. The x/y/z RF generator, which is further described below, generates an RF signal instead of the network analyzer 102 and the sensor measures the impedances Z1 thru Z10.

Figure 1B:
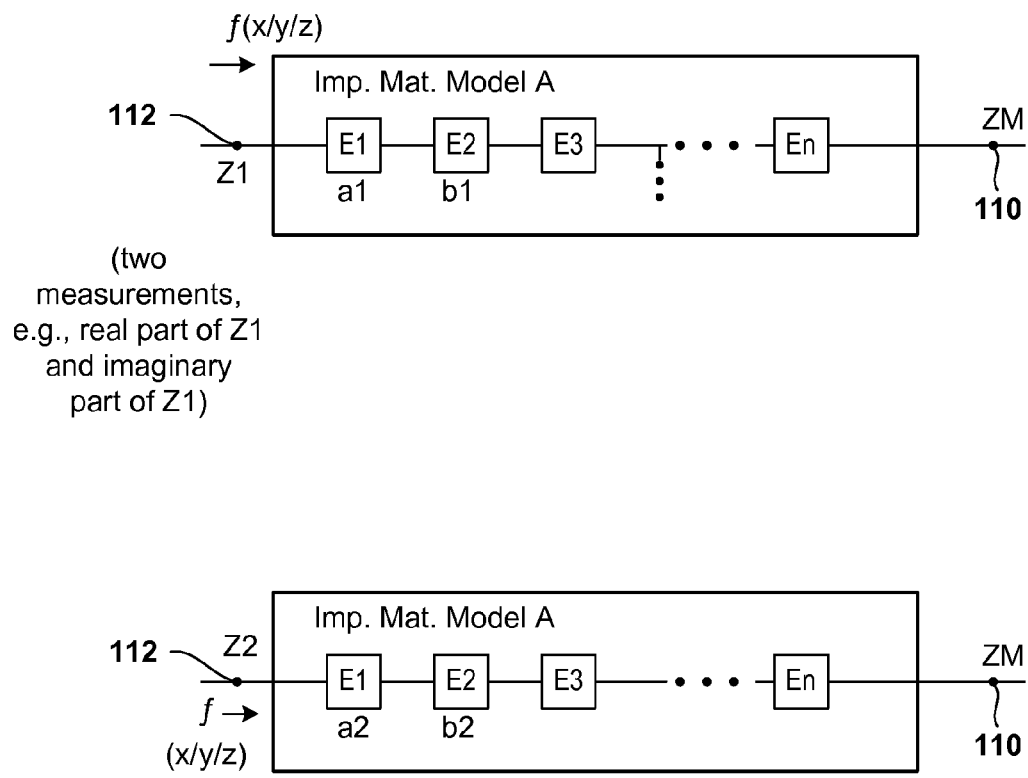
FIG. 1B is a diagram of an embodiment of an impedance matching model that represents the impedance matching networks and is used to generate characteristics for the impedance matching networks.

FIG. 1B is a diagram of an embodiment of an impedance matching model A that is generated by a processor. As used herein, instead of the processor, a central processing unit (CPU), a controller, an application specific integrated circuit (ASIC), or a programmable logic device (PLD) is used, and these terms are used interchangeably herein.

An impedance matching model is derived from e.g., represents, etc., a circuit that is a portion of an impedance matching network that is connected to the x/y/z MHz RF generator. For example, when the x MHz RF generator is connected to a circuit that is a part of the impedance matching network 1 that includes the circuits M1 thru M3 (FIG. 4A) and connections between the circuits M1 thru M3, an impedance matching model represents, e.g., is a computer-generated model of, etc., the circuit of the impedance matching network 1. As another example, an impedance matching model does not have the same number of circuit components as that of the impedance matching network 1. The impedance matching model has a lower number of circuit elements than a number of circuit components of the impedance matching network 1. To illustrate, similar to a section of the impedance matching network 1, the impedance matching model is for receiving an RF signal of the x MHz RF frequency, or the y MHz RF frequency, or the z MHz RF frequency. The impedance matching model is a simplified form of a corresponding section of the impedance matching network 1. Capacitances of multiple capacitors of a section of the impedance matching network 1 are combined, e.g., summed, etc., and represented by one or more capacitive elements of the impedance matching model, and/or inductances of multiple inductors of the section of the impedance matching network 1 are combined, e.g., summed, etc., and represented by one or more inductive elements of the impedance matching model, and/or resistances of multiple resistors of section of the impedance matching network 1 are combined, e.g., summed, etc., and represented by one or more of resistive elements of the impedance matching model.

The impedance matching model A includes elements, e.g., elements E1, E2, E3, thru En, etc., for representing one or more components of the impedance matching network portion 402, where n is an integer greater than zero. As an example, the element E1 has a combined inductance of one or more inductors of a section of the impedance matching network 1, the element E2 has a combined capacitance of one or more capacitors of the section, and the element E3 has a combined resistance of one or more resistors of the section.

As another example, elements e1 thru e18 (FIG. 4C) of an impedance matching model 421 (FIG. 4C) are the same in number as a number of circuit components in the impedance matching network portion 402 (FIG. 4A) and the elements e1 thru e18 are arranged in the same manner as an arrangement of the circuit components in the impedance matching network portion 402. To illustrate, with reference to FIG. 4C, the impedance matching model 421 has the topology 404 of the circuit components of the impedance matching network portion 402, shown in FIG. 4C. To further illustrate, the impedance matching model 421 has the same number of elements e1 thru e18 as a number of the circuit components L1, C1, R1, L2, C2, R2, L3, C3, R3, L4, C4, R4, L5, C5, R5, L6, C6, and R6 of the impedance matching network portion 402. As another illustration, the element e1 is assigned an inductance of the inductor L1, the element e2 is assigned a capacitance of the capacitor C1, the element e3 is assigned a resistance of the resistor R1, the element e4 is assigned an inductance of the inductor L4, the element e5 is assigned a capacitance of the capacitor C4, the element e6 is assigned a resistance of the resistor R4, the element e7 is assigned an inductance of the inductor L2, the element e8 is assigned a capacitance of the capacitor C2, the element e9 is assigned a resistance of the resistor R2, the element e10 is assigned an inductance of the inductor L5, the element e11 is assigned a capacitance of the capacitor C5, the element e12 is assigned a resistance of the resistor R5, the element e13 is assigned an inductance of the inductor L3, the element e14 is assigned a capacitance of the capacitor C3, the element e15 is assigned a resistance of the resistor R3, the element e16 is assigned an inductance of the inductor L6, the element e17 is assigned a capacitance of the capacitor C6, and the element e18 is assigned a resistance of the resistor R6. As yet another illustration, the elements e1 thru e3 are arranged in series to represent a series arrangement of the circuit components L1, C1, and R1 and the elements e4 thru e6 are arranged in a shunt form with respect to the elements e1 thru e3 to represents a shunt arrangement of the circuit components L4, C4, and R4 with respect to the circuit components L1, C1, and R1.

The impedance matching network portion 402 has the output 409. The impedance matching network portion 402 is a circuit that is a part of any of the impedance matching networks 1 thru 10 and the circuit is connected to the x MHz RF generator or the y MHz RF generator or the z MHz RF generator.

The impedance matching network portion 402 is an example of a part of any of the impedance matching networks 1 thru 10 that is connected, via an input, e.g., the input 407 (FIG. 4A), etc., to the S1 port of the network analyzer 102 or to the x/y/z RF generator. The impedance matching model A is stored in a memory device that is accessible to the processor. Examples of a memory device include a read-only memory (ROM), a random access memory (RAM), a hard disk, a volatile memory, a non-volatile memory, a redundant array of storage disks, a Flash memory, etc.

The processor receives the impedance Z1 and the impedance ZM from a user via an input device, e.g., a mouse, a keyboard, a stylus, a touchscreen, a keypad, etc. and an input/output (I/O) interface of a host computer, which includes the processor. Examples of the I/O interface include a parallel port, a serial port, or a universal serial bus (USB) port. The impedance Z1 is measured by the network analyzer 102 when the network analyzer 102 operates within a frequency operating range that includes the frequencies f1 and f2. For example, the network analyzer 102 is operating at the frequency f1 or the frequency f2. Moreover, the impedance Z1 is measured when a position of one or more of the capacitors C1 thru C6 is within a position range from CNT1 thru CNT2 and including CNT1 and CNT2. The position range is an example of the position threshold.

The processor accesses the impedance matching model A from the memory device of the host computer. For example, the impedance matching model A that is stored within the memory device is read from the memory device by the processor. The processor applies the impedance ZM at the input of the load M to an output 110 of the impedance matching model A. The output 110 represents an output of one of the impedance matching circuits 1 thru 10 to which a load, e.g., the load M or a plasma chamber, etc., is connected. When the impedance ZM is applied to the output 110, the processor generates a set of characteristics a1 and b1 of pre-determined elements E1 and E2 of the impedance matching model A to achieve the impedance Z1 at an input 112 of the impedance matching model A. The input 112 represents an input, e.g., the input 407 (FIG. 4A), etc., of one of the impedance matching networks 1 thru 10 to which a source, e.g., the network analyzer 102 or x/y/z RF generator, etc., is connected via an RF cable. The RF cable couples the x/y/z RF generator to the one of the impedance matching networks 1 thru 10.

The impedance Z2 is received by the processor from the user via the input device and the I/O interface of the host computer. The impedance Z2 is measured by the network analyzer 102 when the network analyzer 102 operates in the frequency operating range that includes the frequencies f1 and f2. For example, the impedance Z2 is measured when the network analyzer 102 generates an RF signal having the frequency f1 or the frequency f2. Moreover, the impedance Z2 is measured when the network analyzer 102 is connected to the load M via the impedance matching network 2 that may have one or more variable capacitors satisfying the position threshold. The processor applies the load impedance ZM at the output 110 of the impedance matching model A and adjusts the test characteristics a1 and b1 to generate a set of test characteristics a2 and b2 of the pre-determined elements E1 and E2 of the impedance matching model A to further achieve the impedance Z2 at the input 110 of the impedance matching model A.

In one embodiment, the processor receives another impedance Z3 via the input device from the user. The impedance Z3 of the impedance matching network 3 is measured by the network analyzer 102 when the network analyzer 102 operates in the frequency operating range, e.g., at the frequency f1, at the frequency f2, etc., and when capacitors of the impedance matching network 3 have tap positions within the position range. It should be noted that when the impedance Z3 is measured by the network analyzer 102, the S1 port of the network analyzer 102 is connected to an input, e.g., the input 407 (FIG. 4A), etc., of the impedance matching network 3 and an output, e.g., the output 409, etc., of the impedance matching network 3 is connected to the load M. Moreover, the impedance matching network 3 is coupled to the input of the load M and to the network analyzer 102 after decoupling the impedance matching network 2 from the load M and from the network analyzer 102. When the impedance ZM of the load M is applied by the processor at the output 110 of the impedance matching model A, the processor generates characteristics, e.g., a3 and b3, etc., of the elements E1 and E2 of the impedance matching model A so that the impedance the impedance Z3 is achieved at the input 112.

Figure 1C:
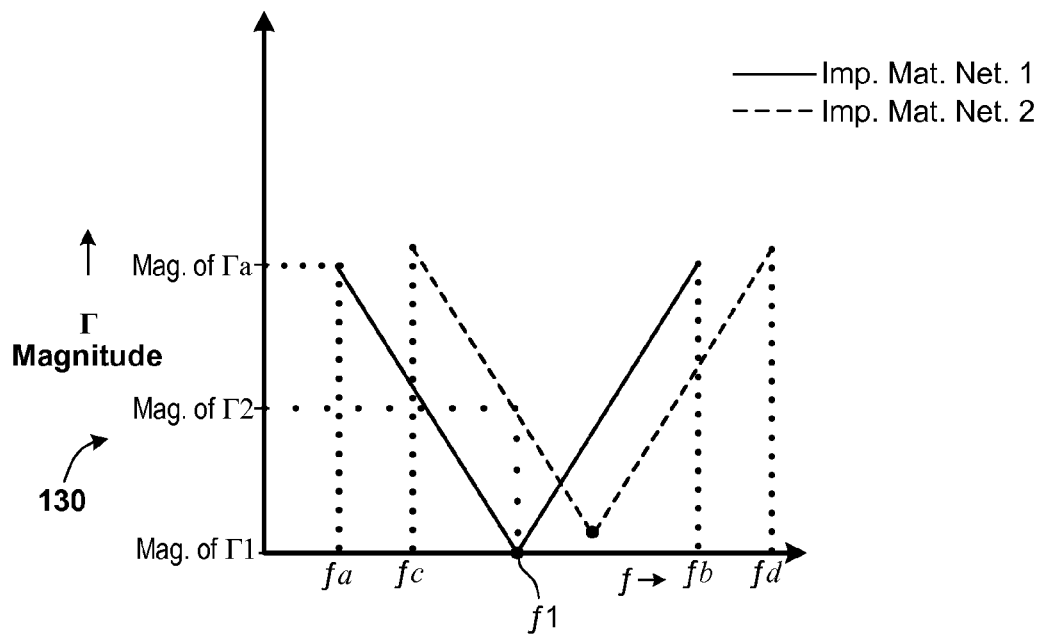
FIG. 1C shows embodiments of graphs to illustrate that impedances are measured for the same frequency or for different frequencies within a frequency operating range.
Figure 1C:
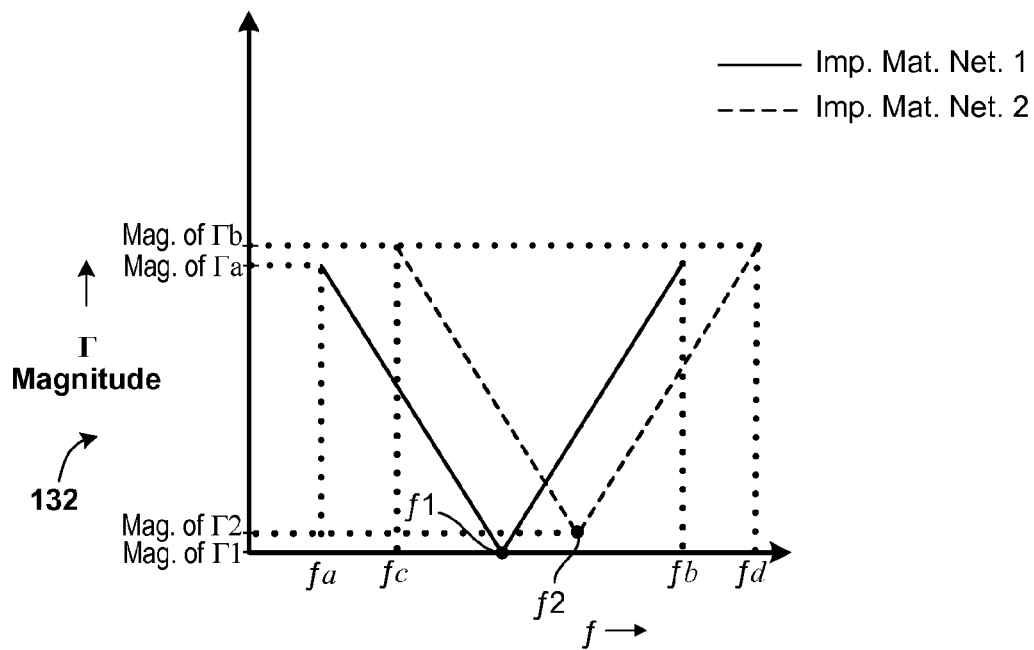
Figure 1D:
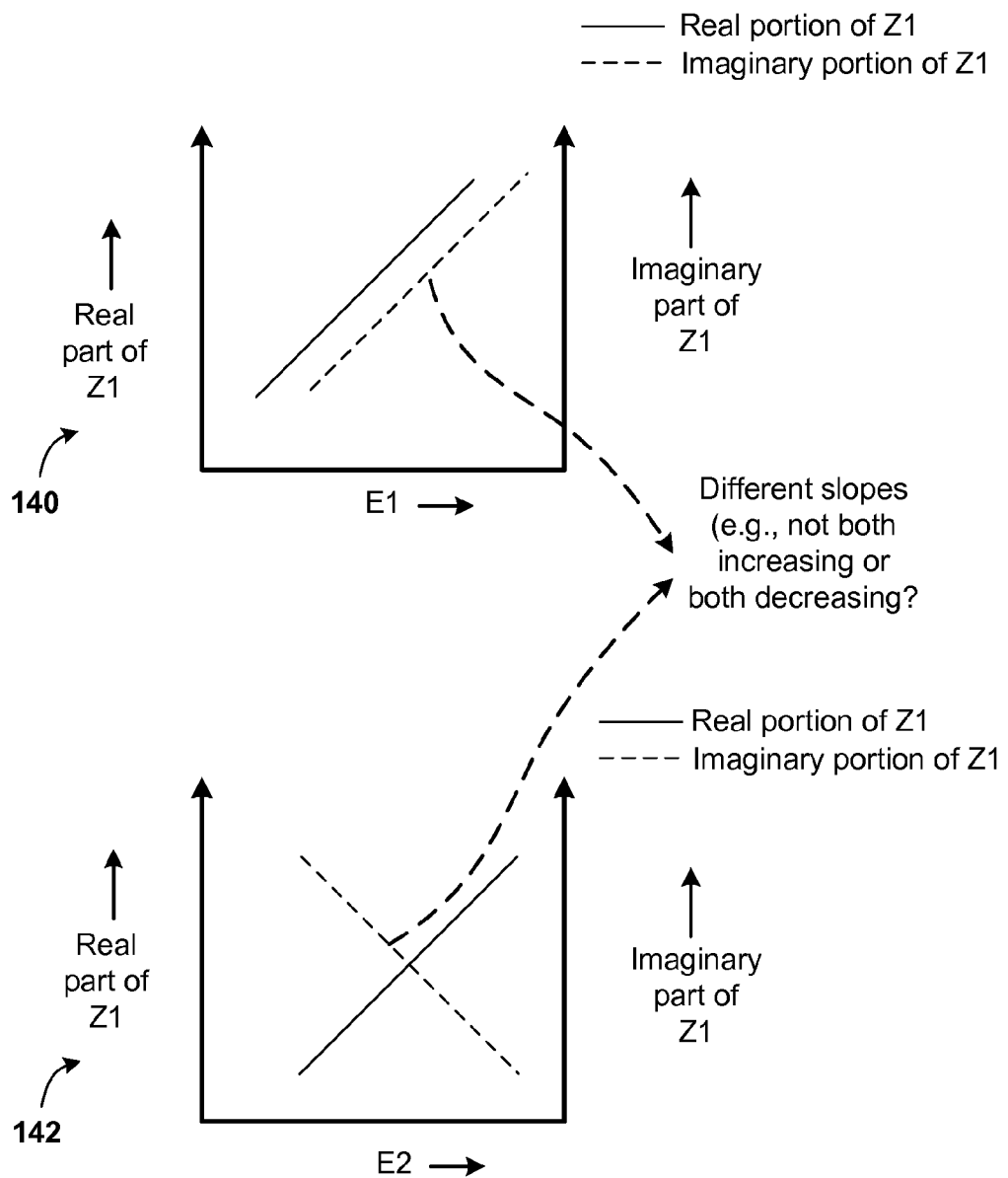
FIG. 1D shows embodiments of graphs to illustrate that elements E1 and E2 behave differently from each other.

In one embodiment, with reference to FIG. 1D, the elements E1 and E2 are selected, e.g., identified, etc., from a group of the elements E1 thru En when a change in a characteristic of the element E1 results in a change in real and/or imaginary parts of the impedance Z1 in a first direction and when a change in a characteristic of the element E2 results in a change in real and/or imaginary parts of the reference impedance Z1 in a second direction, which is different from, e.g., opposite to, etc., the first direction. For example, FIG. 1D is an embodiment of a graph 140 that plots a characteristic, e.g., an inductance or a capacitance, etc., of the element E1 versus a real portion of the impedance Z1 and an imaginary portion of the impedance Z1. Also shown is an embodiment of a graph 142 that plots a characteristic, e.g., an inductance or a capacitance, etc., of the element E2 versus the real portion of the impedance Z1 and the imaginary portion of the impedance Z1. As illustrated, with an increase in a characteristic of the element E1, there is an increase in real and imaginary portions of the impedance Z1 and with an increase in a characteristic of the element E2, there is a decrease in an imaginary portion of the impedance Z1 and an increase in a real portion of the impedance Z1. A slope of the real and imaginary portions of the impedance Z1 is positive when a characteristic of the element E1 is increased and a slope of the imaginary portion of the impedance Z1 is negative when a characteristic of the element E2 is increased. The elements E1 and E2 are selected from the group of the elements E1 thru En by the user or by the processor. As another example, a change in a characteristic of the element E1 affects, e.g., changes, etc., a real part of the impedance Z1 and does not affect the imaginary part of the impedance Z1. Moreover, in this example, a change in a characteristic of the element E2 changes an imaginary part of the impedance Z1 and does not affect the real part of the impedance Z1.

It should be noted that in one embodiment, an impedance matching model, as described herein, is a computer-generated model that is generated by the processor of the host computer.

FIG. 1C shows graphs 130 and 132 to illustrate that the impedances Z1 and Z2 are measured for the same frequency f1 or for different frequencies f1 and f2 within the frequency operating range. Each graph 130 and 132 plots a magnitude of a complex voltage reflection coefficient Γ of impedance matching networks 1 and 2 versus frequencies of operation of the network analyzer 102. There is a one-to-one correspondence between a voltage reflection coefficient Γ of each of the impedance matching networks 1 and 2 and impedance Z of the impedance matching network. For example, the impedance Z1 maps to a complex voltage reflection coefficient Γ1 and the impedance Z2 maps to a complex voltage reflection coefficient Γ2. As another example, an impedance is calculated by the network analyzer 102 from a complex voltage reflection coefficient and vice versa. As illustrated using the graph 130, the magnitudes of complex voltage reflection coefficients Γ1 and Γ2 measured by the network analyzer 102 correspond to the same frequency f1 of operation of the network analyzer 102. For example, when the network analyzer 102 supplies an RF signal having the frequency f1 to the impedance matching network 1, the network analyzer 102 measures the magnitude of the complex voltage reflection coefficient Γ1. Moreover, in this example, when the network analyzer 102 supplies an RF signal having the frequency f1 to the impedance matching network 2, the network analyzer 102 measures the magnitude of the complex voltage reflection coefficient Γ2. It should be noted that as shown in graph 130, the magnitude of the complex voltage reflection coefficient Γ2 is not a minimum value of magnitudes of complex voltage reflection coefficients that are measured by the network analyzer 102 when the network analyzer 102 generates RF signals having different frequencies ranging from fc to fd. The magnitude of the complex voltage reflection coefficient Γ1 is a minimum of magnitudes of complex voltage reflection coefficients that are measured by the network analyzer 102 when the network analyzer 102 generates RF signals having different frequencies ranging from fa to fb.

As shown in the graph 132, the magnitudes of complex voltage reflection coefficients Γ1 and Γ2 measured by the network analyzer 102 correspond to different frequencies f1 and f2. For example, when an RF signal having the frequency f1 is generated by the network analyzer 102, which is connected to the impedance matching network 1, the network analyzer 102 measures the magnitude of the complex voltage reflection coefficient Γ1. Moreover, in this example, when an RF signal having the frequency f2 is generated by the network analyzer 102, which is connected to the impedance matching network 2, the network analyzer 102 measures the magnitude of the complex voltage reflection coefficient Γ2. The magnitude of the complex voltage reflection coefficient Γ1 is a minimum of magnitudes ranging from the magnitude of Γ1 to the magnitude of Fa that are measured by the network analyzer 102 when the network analyzer 102 generates RF signals having different frequencies ranging from fa to fb. Moreover, the magnitude of the complex voltage reflection coefficient Γ2 is a minimum of magnitudes ranging from the magnitude of Γ2 to the magnitude of Γb that are measured by the network analyzer 102 when the network analyzer 102 generates RF signals having different frequencies ranging from fc to fd.

FIG. 1D shows embodiments of graphs 140 and 142 to illustrate that the elements E1 and E2 behave differently from each other. The graph 140 plots real and imaginary parts of the impedance Z1 versus a characteristic, e.g., inductance or capacitance, etc., of the element E1. Moreover, the graph 142 plots real and imaginary parts of the impedance Z2 versus a characteristic, e.g., inductance or capacitance, etc., of the element E2.

The elements E1 and E2 are selected by the user or by the processor such that the elements E1 and E2 have different behavior. For example, real and/or imaginary parts of the impedance Z1 change with a change in a characteristic of the element E1 in a direction different from, e.g., opposite to, etc., a direction in which real and/or imaginary parts of the impedance Z1 change with a change in a characteristic of the element E2. For example, a change in a characteristic of the element E1 affects the real part of the impedance Z1 but does not affect the imaginary part of the impedance Z1, and a change in a characteristic of the element E2 affects the imaginary part of the impedance Z1 but not affect the real part of the impedance Z1. As another example, an increase in a characteristic of the element E1 increases the real and imaginary parts of the impedance Z1 and an increase in a characteristic of the element E2 decreases the imaginary part of the impedance Z1 and increases the real part of the impedance Z1.

Figure 2A:
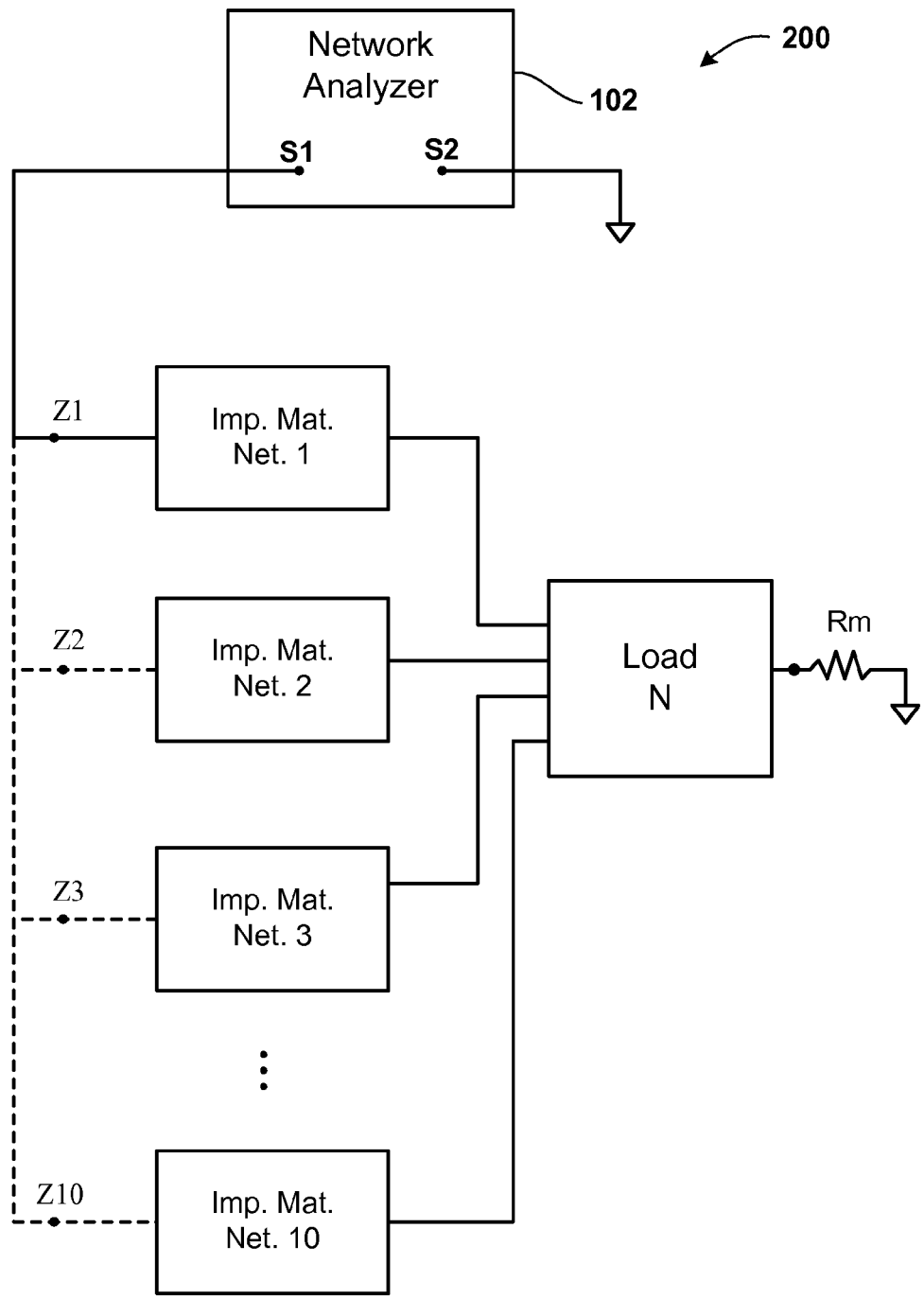
FIG. 2A is a diagram of an embodiment of a system for illustrating measurement of impedances associated with the different impedance matching networks.

FIG. 2A is a diagram of an embodiment of a system 200 for illustrating measurement of the impedances Z1 thru Z10 associated with the different impedance matching networks 1 thru 10. An S1 port of the network analyzer 102 is connected to an input, e.g., the input 407 (FIG. 4A), etc., of the impedance matching network 1 and an S2 port of the network analyzer 102 is grounded. Moreover, an output, e.g., the output 409 (FIG. 4A), etc., of the impedance matching network 1 is connected to a load N, which is further connected to a resistor Rm.

The load N includes an inductive component and/or a capacitive component. For example, the load N includes one or more capacitors and/or one or more inductors.

In one embodiment, the load N has minimal or no resistance, e.g., less than 50 ohms, etc.

An example of the resistor Rm includes a 50 ohm resistor. In one embodiment, any other resistor, e.g., a resistor having a resistance of 40 ohms or a resistance of 60 ohms or a resistance ranging from 40 ohms to 60 ohms, etc., is used. The resistor Rm is connected to ground.

A combined impedance of the load N and the resistor Rm is ZNm, which is impedance at the output of any of the impedance matching networks 1 thru 10 or at the input of the load M.

An RF signal within the frequency operating range, e.g., the frequency f1, the frequency f2, etc., is supplied from the S1 port of the network analyzer 102 to the input of the impedance matching network 1. The RF signal is transferred via the impedance matching network 1, the load N, and the resistor Rm to ground. For example, the impedance matching network 1 matches an impedance of a load, e.g., the load N and the resistor Rm, etc., connected at the output of the impedance matching network 1 with that of a source, e.g., the network analyzer 102, etc., to generate a modified RF signal. The modified RF signal is sent from the impedance matching network 1 to the load N to generate yet another modified RF signal. The other modified signal is sent from the load N to the resistor Rm to produce still another RF signal, which is sent from the resistor Rm to the ground.

The network analyzer 102 measures and stores the impedance Z1, which is an impedance at the input of the impedance matching network 1. After measuring the impedance Z1 at the input of the impedance matching network 1, the impedance matching network 1 is decoupled from the network analyzer 102 and the load N, and the impedance matching network 2 is connected to the load N and the S1 port of the network analyzer 102. For example, an input, e.g., the input 407, etc., of the impedance matching network 2 is connected to the S1 port and an output, e.g., the output 409 (FIG. 4A), etc., of the impedance matching network 2 is connected to the input of the load N. An RF signal having a frequency, e.g., the frequency f1, the frequency f2, etc., within the frequency operating range is supplied by the network analyzer 102 from the port S1 to the impedance matching network 102 and the RF signal is modified by the impedance matching network 102 to generate a modified RF signal, which is further modified by the load N to generate another modified RF signal. The other modified RF signal is further modified by the resistor Rm. The impedance Z2 at the input of the impedance matching network 2 is measured by the network analyzer 102.

Similarly, the impedances Z3 thru Z10 at inputs of the impedance matching networks 3 thru 10 are calculated by the network analyzer 102. For example, the impedance Z3 is calculated by the network analyzer 102 after disconnecting the impedance matching network 2 from the network analyzer 102 and from the load N, and connecting the impedance matching network 3 to the S1 port of the network analyzer 102 and to the load N.

It should be noted that in one embodiment, instead of ten impedance matching networks, any other number, e.g., two, three, six, twelve, etc., of impedance matching networks are used. Moreover, the impedance matching networks 1 thru 10 of FIG. 2A are the same as the impedance matching networks 1 thru 10 of FIG. 1A. For example, a tap position of a variable capacitor of the impedance matching networks 1 and 2 is within the position threshold.

It should be noted that in one embodiment, instead of using the load N and the resistor Rm, the plasma chamber, which is further described below, is used as a load, and instead of using the network analyzer 102, an x/y/z RF generator and a sensor, e.g., an impedance sensor, etc., is used to measure the impedances Z1 thru Z10.

Figure 2B:
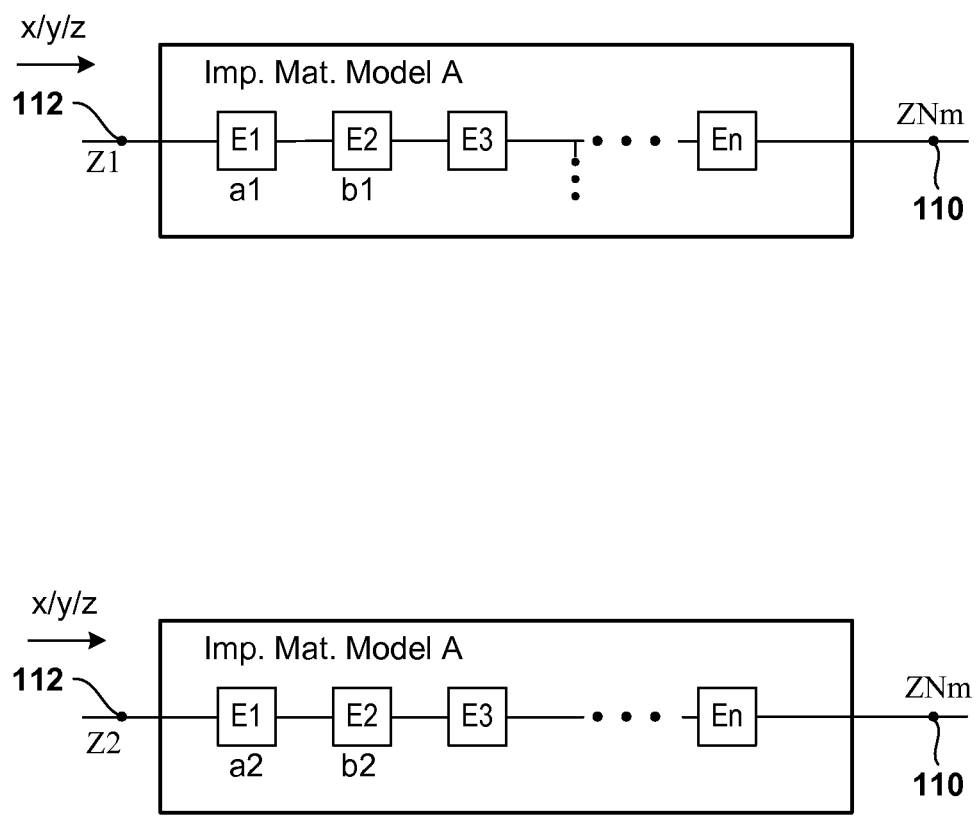
FIG. 2B is a diagram of an embodiment of the impedance matching model that includes the elements E1 and E2, whose characteristics are determined from impedances measured using the system of FIG. 2A.

FIG. 2B is a diagram of an embodiment of the impedance matching model A that includes the elements E1 and E2, whose characteristics are determined from impedances measured using the system 200 of FIG. 2A. The processor of the host computer receives the impedance ZNm, which is a sum of impedance of the load N and impedance of the resistor Rm, from the user via the input device coupled to the processor and the I/O interface of the host computer and further receives the impedance Z1 at the input of the impedance matching network 1 from the user via the input device coupled to the processor and the I/O interface of the host computer.

The processor accesses, e.g., reads, etc., the impedance matching model A from the memory device of the host computer. The processor applies the impedance ZNm at the output 110 of the impedance matching model A and generates the characteristics a1 and b1 of the elements E1 and E2 of the impedance matching model A to achieve the impedance Z1 at the input 112 of the impedance matching model A.

Furthermore, the processor receives the impedance Z2 at the input of the impedance matching network 2 from the user via the input device connected to the processor and the I/O interface of the host computer. The processor applies the impedance ZNm at the output 110 of the impedance matching model M and adjusts the characteristics a1 and b1 to generate characteristics a2 and b2 of the elements E1 and E2 so that the impedance Z2 of the impedance matching network 2 is achieved at the input 112 of the impedance matching model A.

Figure 3A:
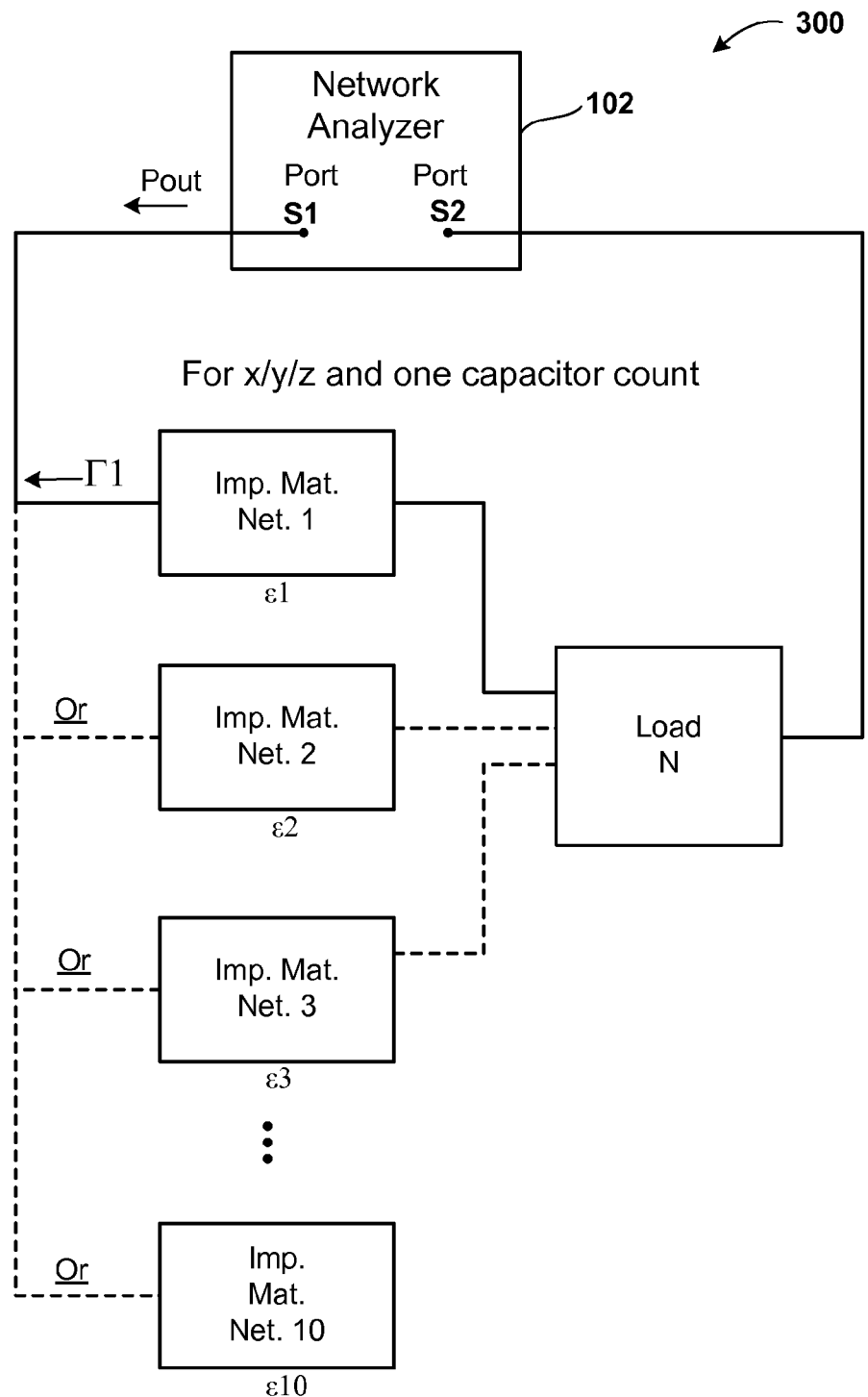
FIG. 3A is a diagram of an embodiment of a system for measuring efficiencies by using S parameters of a network analyzer.

FIG. 3A is a diagram of an embodiment of a system 300 for measuring power efficiencies ∈ by using S11 and S12 parameters of the network analyzer 102. An input, e.g., the input 407 (FIG. 4A), etc., of the impedance matching network 1 is connected to the S1 port of the network analyzer 102 and an output, e.g., the output 409 (FIG. 4A), etc., of the impedance matching network 1 is connected to an input of the load N. The output of the load N is connected to an S2 port of the network analyzer 102.

An RF signal having a frequency, e.g., the frequency f1 or the frequency f2, etc., within the frequency operating range is supplied from the S1 port of the network analyzer 102. The impedance matching network 1 receives the RF signal and matches an impedance of a load, e.g., the load N and the S2 port, etc., connected to the output of the impedance matching network 1 with that of a source, e.g., the S1 port, etc., connected to the input of the impedance matching network 1 to generate a modified RF signal. The modified RF signal is sent from the impedance matching network 1 to the load N, which generates another modified signal from the received modified signal. The other modified signal is provided by the load N to the S2 port of the network analyzer 102. The network analyzer 102 calculates an efficiency ∈1 of the impedance matching network 1 as a ratio of power at output of the matching network 1 and power input into the impedance matching network 1.

The power input into the impedance matching network 1 is Pout X $(1-\Gamma 1^2)$, where Pout is complex power out from the port S1 of the network analyzer 102 and Γ1 is the complex voltage reflection coefficient of voltage reflected from the input of the matching network 1 towards the S1 port, where "X" represents multiplication. The complex voltage reflection coefficient Γ1 is measured by network analyzer 102 at the port S1. Complex power output from the impedance matching network 1 is a sum of the complex power PloadN consumed by the load N and complex power measured at the port S2 of the network analyzer 102. The complex power measured at the port S2 by the network analyzer 102 is Pout X $(s21)^2$, where s21 is a scattering parameter measured at the port S2 by the network analyzer 102, and "X" represents multiplication. The complex power PloadN consumed by the load N is measured or estimated separately and is provided by the user to the network analyzer 102 via the input device connected to the network analyzer 102. The network analyzer 102 calculates the ∈1 efficiency of the impedance matching network 1 as:

$$\in 1=[(s21)^2+(P\text{load}N/P\text{out})]/(1-\Gamma 1^2) \quad (1)$$

The impedance matching network 1 is decoupled from the network analyzer 102 and from the load N. After the decoupling of the impedance matching network 1, an input, e.g., the input 407 (FIG. 4A), etc., of the impedance matching network 2 is connected to the S1 port of the network analyzer 102 and an output, e.g., the output 409 (FIG. 4A), etc., of the impedance matching network 2 is connected to the load N, which is connected to the S2 port of the network analyzer 102. An RF signal having a frequency, e.g., the frequency f1 or the frequency f2, etc., within the frequency operating range is generated and supplied by the network analyzer 102 to the input of the impedance matching network 2. The impedance matching network 2 matches an impedance of a load, e.g., the load N, etc., connected to the output of the impedance matching network 2 with that of a source, e.g., the S1 port of the network analyzer 102, etc., to generate a modified signal. The modified signal is sent from the impedance matching network 2 to the input of the load N, which further modifies the modified signal received. The further modified signal is provided from the output of the load N to the S2 port of the network analyzer 102.

The network analyzer 102 measures an efficiency ∈2 of the impedance matching network 2 as follows:

$$\in 2=[(s21)^2+(P\text{load}N/P\text{out})]/(1-\Gamma 2^2) \quad (2)$$

where Γ2 is the complex voltage reflection coefficient of voltage reflected from the input of the matching network 2 towards the S1 port. The complex voltage reflection coefficient Γ2 is measured by network analyzer 102 at the port S1.

Similarly, the impedance matching network 2 is disconnected from the network analyzer 102 to connect the impedance matching network 3 to the network analyzer 102 and the load N to measure the efficiency ∈3 at the input of the impedance matching network 3. Thereafter, similarly, the efficiencies ∈4 thru ∈10 of the impedance matching networks 4 thru 10 are measured by the network analyzer 102.

It should be noted that in one embodiment, instead of ten impedance matching networks, any other number, e.g., two, three, six, twelve, etc., of impedance matching networks are used. Moreover, the impedance matching networks 1 thru 10 of FIG. 3A are the same as the impedance matching networks 1 thru 10 of FIG. 1A. For example, positions of capacitors of the impedance matching networks 1 and 2 are within the position threshold.

In one embodiment, the network analyzer 102 measures the impedances Z1 thru Z10 in a manner similar to that described above with reference to FIG. 2A. For example, the network analyzer 102 measures the impedances Z1 thru Z10 when the corresponding impedance matching networks 1 thru 10 are connected to the load N.

In an embodiment, a combined impedance of the load N and of the S2 port mimics an impedance of a plasma chamber and plasma in the plasma chamber.

Figure 3B:
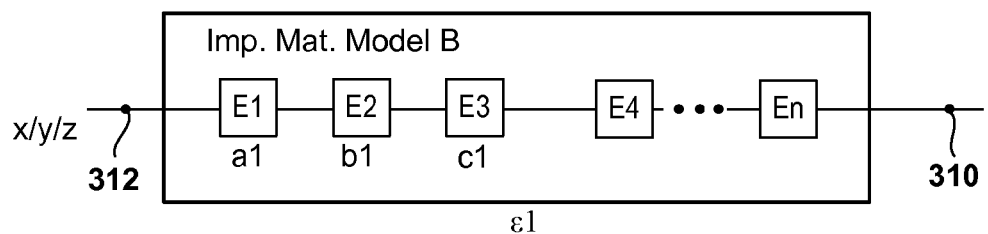
FIG. 3B is a diagram of an embodiment of an impedance matching model to illustrate use of the efficiencies to generate characteristics of elements E1, E2, and E3 of an impedance matching model.
Figure 3B:
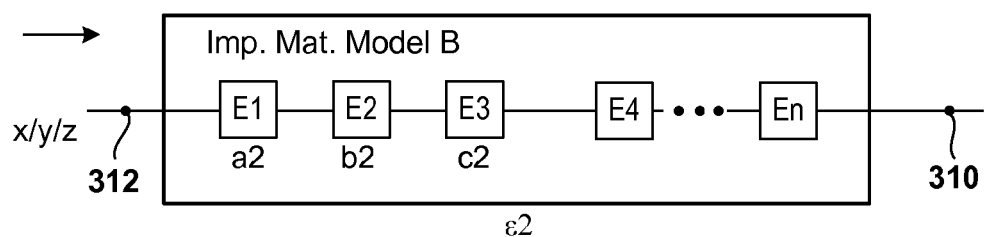
Figure 4A:
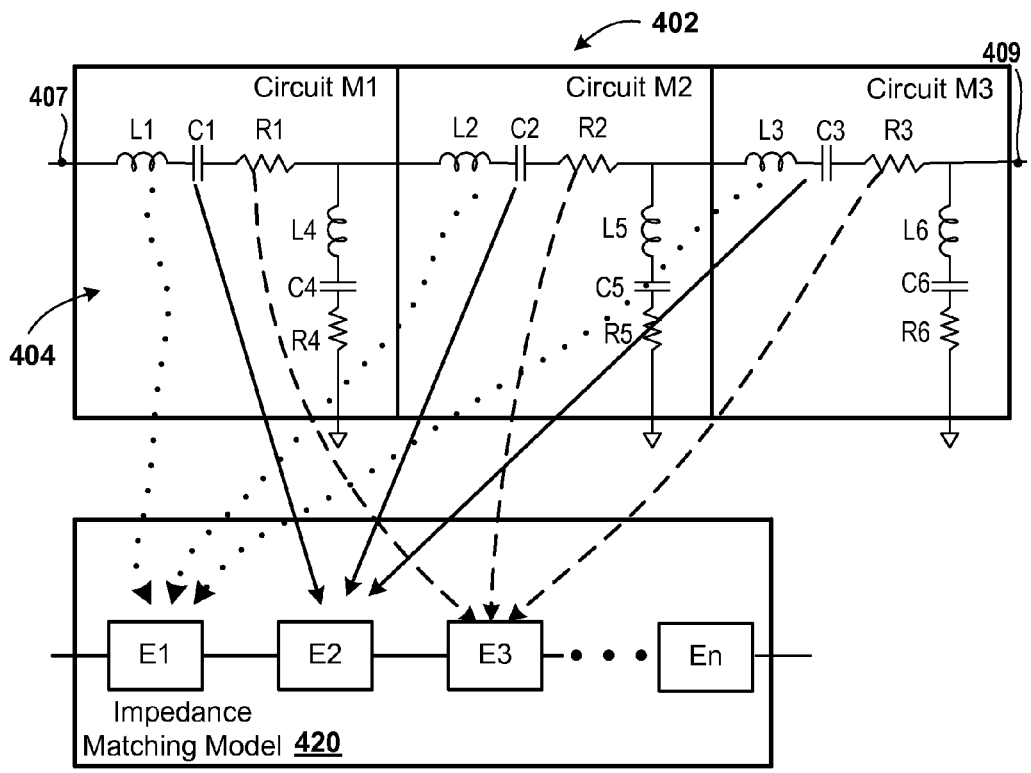
FIG. 4A is a diagram of an embodiment of an impedance matching network portion and an impedance matching model to illustrate that an element within the impedance matching model is modified to represent changes in values of multiple components within the impedance matching network portion.

FIG. 3B is a diagram of an embodiment of an impedance matching model B to illustrate generation of characteristics of elements E1, E2, and E3 of the impedance matching model B. In one embodiment, the impedance matching model B is the same as the impedance matching model A except in the impedance matching model B, the element E3, which is a resistive element, is variable. As an example, the impedance matching model B has the topology 404 (FIG. 4A).

Moreover, the elements E1 and E2 are the same as that described above with reference to FIGS. 1B and 2B. For example, the element E1 has a capacitance and the element E2 has an inductance. As another example, the element E1 has an inductance and the element E2 has a capacitance. As yet another example, both the elements E1 and E2 have either capacitances or inductances.

The processor of the host computer receives from the user via the input device connected to the processor and the I/O interface of the host computer the efficiency ∈1 measured when the network analyzer 102 is operating in the frequency operating range. The processor of the host computer accesses, e.g., reads, etc., the impedance matching model B from the memory device of the host computer.

The processor of the host computer generates characteristics a1, b1, and c1 of the elements E1, E2, and E3 so that the efficiency ∈1 of the impedance matching model B is achieved. For example, the processor of the host computer calculates the characteristic a1 of the element E1, the characteristic b1 of the element E2, and the characteristic c1 of the element E3 so that the efficiency ∈1 is achieved between an input 312 of the impedance matching model B and an output 310 of the impedance matching model B.

Moreover, the processor receives the efficiency ∈2 from the user via the input device coupled to the processor and the I/O interface of the host computer. The processor adjusts the characteristics a1, b1, and c1 to generate characteristics a2, b2, and c2 of the elements E1, E2, and E3 to achieve the efficiency ∈2 of the impedance matching model B. For example, the processor of the host computer calculates the characteristic a2 of the element E1, the characteristic b2 of the element E2, and the characteristic c2 of the element E3 so that the efficiency ∈2 is achieved between the input 312 and the output 310.

In one embodiment, the processor receives the impedance Z1 and the impedance ZN from a user via the input device and the input/output (I/O) interface of the host computer. The processor accesses the impedance matching model B from the memory device of the host computer. For example, the impedance matching model B that is stored within the memory device is read from the memory device by the processor. The processor applies the impedance ZN at the input of the load N to the output 310 of the impedance matching model B. When the impedance ZN is applied to the output 310, the processor generates the set of characteristics a1 and b1 of the pre-determined elements E1 and E2 of the impedance matching model B to achieve the impedance Z1 at an input 312 of the impedance matching model B. The impedance Z2 is received by the processor from the user via the input device and the I/O interface of the host computer. The processor applies the load impedance ZN at the output 310 of the impedance matching model B and adjusts the test characteristics a1 and b1 to generate the set of test characteristics a2 and b2 of the pre-determined elements E1 and E2 of the impedance matching model B to further achieve the impedance Z2 at the input 310 of the impedance matching model B.

In one embodiment, when the impedance ZN is applied at the output 310 of the impedance matching model B, the processor generates the characteristics a1, b1, and c1 of the elements E1, E2, and E3 to achieve the efficiency ∈1 of the impedance matching model B and to achieve the impedance Z1 at the input 312 of the impedance matching model B. For example, the processor of the host computer calculates the characteristic a1 of the element E1, the characteristic b1 of the element E2, and the characteristic c1 of the element E3 so that the efficiency ∈1 of the impedance matching model B and the impedance Z1 at the input 312 of the impedance matching model B are achieved. Moreover, the processor of the host computer adjusts the characteristics a1, b1, and c1 to generate characteristics a2, b2, and c2 of the elements E1, E2, and E3 to further achieve the efficiency ∈2 of the impedance matching model B and the impedance Z2 at the input 312 of the impedance matching model B. For example, the processor of the host computer calculates the characteristic a2 of the element E1, the characteristic b2 of the element E2, and the characteristic c2 of the element E3 so that the efficiency ∈2 of the impedance matching model B is achieved and the impedance Z2 is achieved at the input 312.

FIG. 4A is a diagram of an embodiment of the impedance matching network portion 402 and the impedance matching model 420 to illustrate that an element within the impedance matching model 420 represents changes in values of one or more circuit components within the impedance matching network portion 402. The impedance matching model 420 is an example of the impedance matching model A or of the impedance matching model B.

Each resistor R1 thru R3 exhibits a variety of resistance values, e.g., is variable or resistance exhibited by each resistor R1 thru R3 changes from one impedance matching network to another, etc., and each resistor R4 thru R6 is fixed, e.g., does not exhibit a variety of resistance values from one impedance matching network to another. To illustrate, when the resistor R1 is implemented within the impedance matching network 1, the resistor R1 exhibits a slightly different resistance to an RF signal than a resistance exhibited to an RF signal by the resistor R1 when the resistor R1 is implemented within the impedance matching network 2. In this illustration, the resistor R1 has the same theoretical resistance value, e.g., a value embedded on a face of the resistor R1, etc. Moreover, in the illustration, when the resistor R4 is implemented within the impedance matching network 1, the resistor R4 is fixed, e.g., does not exhibit a slightly different resistance to an RF signal than a resistance exhibited to an RF signal by the resistor R4 when the resistor R4 is implemented within the impedance matching network 2, etc.

The element E3 of the impedance matching model B represents the change in values of all the three resistors R1 thru R3 having values that vary from one impedance matching network to another.

In one embodiment, the element E3 represents a change in values of any number, e.g., two, four, etc., of resistors of the impedance matching network portion 402. For example, the element E3 represents a change in resistances exhibited by the resistors R1 and R2 but does not represent the resistors R3-R6. In this example, the values of the resistors R3-R6 do not change from one impedance matching network to another, e.g., when implemented in one of the impedance matching networks 1 thru 10 or another one of the impedance matching networks 1 thru 10, etc.

In an embodiment, each capacitor C1 thru C3 exhibits a variety of capacitance values, e.g., is variable or capacitance exhibited by each capacitor C1 thru C3 changes from one impedance matching network to another, etc., and each capacitor C4 thru C6 is fixed, e.g., does not exhibit a variety of capacitance values from one impedance matching network to another, etc. To illustrate, when the capacitor C1 is implemented within the impedance matching network 1, the capacitor C1 exhibits a slightly different capacitance to an RF signal than a capacitance exhibited to an RF signal by the capacitor C1 when the capacitor C1 is implemented within the impedance matching network 2. In this illustration, the capacitor C1 has the same theoretical resistance value, e.g., a value embedded on a face of the capacitor C1, etc. Moreover, in the illustration, when the capacitor C4 is implemented within the impedance matching network 1, the capacitor C4 does not exhibit a slightly different capacitance to an RF signal than a capacitance exhibited to an RF signal by the capacitor C4 when the capacitor C4 is implemented within the impedance matching network 2.

The element E2 of the impedance matching model B represents the change in values of all the three capacitors C1 thru C3 having values that vary from one impedance matching network to another.

In one embodiment, the element E2 represents a change in values of any number, e.g., two, four, five, etc., of capacitors of the impedance matching network portion 402. For example, the element E2 represents a change in capacitances exhibited by the capacitors C1, C2, and C4 but does not represent the capacitors C3, C5, and C6. In this example, the values of the capacitors C3, C5, and C6 do not change from one impedance matching network to another, e.g., when implemented in one of the impedance matching networks 1 thru 10 or another one of the impedance matching networks 1 thru 10, etc.

In one embodiment, each inductor L1 thru L3 exhibits a variety of inductance values, e.g., is variable or inductance exhibited by each inductor L1 thru L3 changes from one impedance matching network to another, etc., and each inductor L4 thru L6 is fixed, e.g., does not exhibit a variety of inductance values from one impedance matching network to another, etc. To illustrate, when the inductor L1 is implemented within the impedance matching network 1, the inductor L1 exhibits a slightly different inductance to an RF signal than an inductance exhibited to an RF signal by the inductor L1 when the inductor L1 is implemented within the impedance matching network 2. In this illustration, the inductor L1 has the same theoretical resistance value, e.g., a value embedded on a face of the inductor L1, etc. Moreover, in the illustration, when the inductor L4 is implemented within the impedance matching network 1, the inductor L4 does not exhibit a slightly different inductance to an RF signal than an inductance exhibited to an RF signal by the inductor L4 when the inductor L4 is implemented within the impedance matching network 2.

The element E1 of the impedance matching model B represents the change in values of all the three inductors I1 thru I3 having values that vary from one impedance matching network to another.

In one embodiment, the element E1 represents a change in values of any number, e.g., two, four, five, six, etc., of inductors of the impedance matching network portion 402. For example, the element E1 represents a change in inductances exhibited by the inductors I1, I2, and I5 but does not represent the inductors I3, I5, and I6. In this example, the values of the inductors I1, I2, and I5 do not change from one impedance matching network to another, e.g., when implemented in one of the impedance matching networks 1 thru 10 or another one of the impedance matching networks 1 thru 10, etc.

Figure 4B:
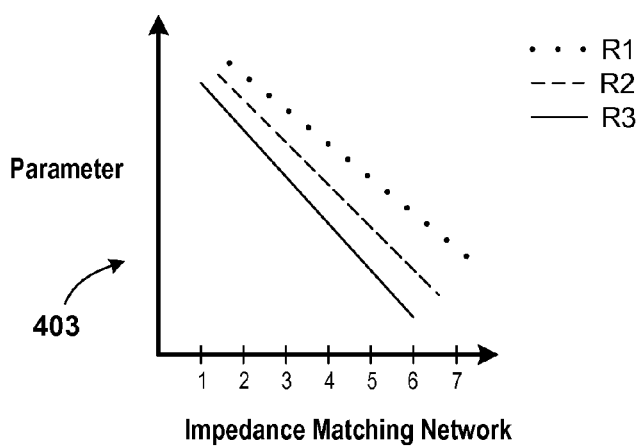
FIG. 4B is an embodiment of a graph to illustrate that components of the impedance matching network portion that are represented by an element of an impedance matching model behave similar to each other.

FIG. 4B is an embodiment of a graph 403 to illustrate that components of the impedance matching network portion 402 that are represented by an element, e.g., the element E1 or the element E2 or the element E3, etc., of the impedance matching model 420 behave similar to each other. For example, a change in a parameter associated with the resistor R1, e.g., a current passing through the resistor R1 or a voltage across the resistor R1, etc., occurs in a direction of change in the parameter associated with the resistor R2 and in the direction of change in the parameter associated with the resistor R3. To further illustrate, a slope of a parameter for the three resistors R1 thru R3 is either positive or negative. As another example, a change in a parameter associated with the capacitor C1, e.g., a current passing through the capacitor C1 or a voltage across the capacitor C1, etc., occurs in a direction of change in the parameter associated with the capacitor C2 and in the direction of change in the parameter associated with the capacitor C3. As yet another example, a change in a parameter associated with the inductor L1, e.g., a current passing through the inductor L1 or a voltage across the inductor L1, etc., occurs in a direction of change in the parameter associated with the inductor L2 and in the direction of change in the parameter associated with the inductor L3. The graph 403 plots a parameter versus an impedance matching network, e.g., any of the impedance matching networks 1 thru 10, etc.

It should be noted that a change in a parameter associated with a circuit component occurs when the circuit component is implemented across different impedance matching networks 1 thru 10. For example, the resistor R1 exhibits different resistance to a current that passes through the resistor R1 when the resistor R1 is implemented within the impedance matching network 1 compared to when the resistor R1 is implemented within the impedance matching network 2. As another example, the capacitor C1 exhibits different capacitance to a current that passes through the capacitor C1 when the capacitor C1 is implemented within the impedance matching network 1 compared to when the capacitor C1 is implemented within the impedance matching network 2.

Figure 4C:
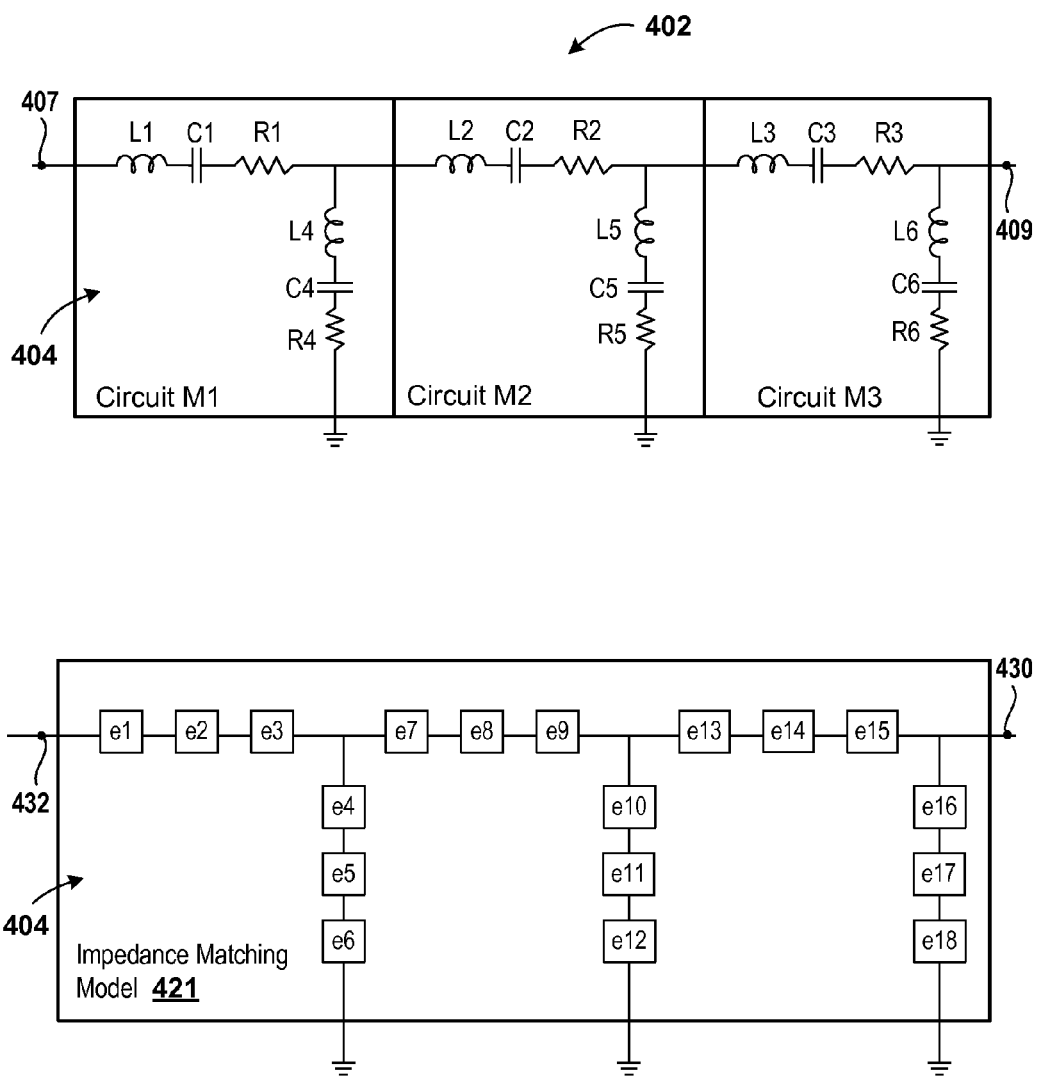
FIG. 4C is a diagram of an embodiment of the impedance matching network portion and an impedance matching model to illustrate that characteristics of multiple components are represented by one element of the impedance matching model.

FIG. 4C is a diagram of an embodiment of the impedance matching network portion 402 and the impedance matching model 421 to illustrate that the impedance matching model 421 and the impedance matching network portion 402 has the same topography. The impedance matching model 421 includes an output 430, which is an example of the output 110 (FIGS. 1B and 2B) of the impedance matching model A or the output 310 (FIG. 3B) of the impedance matching model B. Moreover, the impedance matching model 421 includes an input 432, which is an example of the input 112 (FIGS. 1B and 2B) of the impedance matching model A or the input 312 (FIG. 3B) of the impedance matching model B. The impedance matching model 421 is an example of the impedance matching model A or the impedance matching model B.

As shown, the element e1 represents the inductor L1, the element e2 represents the capacitor C1, and the element e3 represents the resistor R1. For example, the element e1 has the same theoretical inductance as that of the inductor L1, e.g., inductance indicated on a front face of the inductor L1, etc. Similarly, the element e2 has the same theoretical capacitance as that of the capacitor C1 and the element e3 has the same theoretical resistance as that of the resistor R1.

Moreover, in a similar manner, the element e4 represents the inductor L4, the element e5 represents the capacitor C4, and the element e6 represents the resistor R4. Also, in a similar manner, the element e7 represents the inductor L2, the element e8 represents the capacitor C2, and the element e9 represents the resistor R2. Furthermore, in a similar manner, the element e10 represents the inductor L5, the element e11 represents the capacitor C5, and the element e12 represents the resistor R5. Moreover, in a similar manner, the element e13 represents the inductor L3, the element e14 represents the capacitor C3, and the element e15 represents the resistor R3. In a similar manner, the element e16 represents the inductor L6, the element e17 represents the capacitor C6, and the element e18 represents the resistor R6.

The elements e1 thru e18 have the same topography as that of the components L1 thru L6, C1 thru C6, and R1 thru R6. For example, the elements e1 thru e3 are connected in series to represent the components L1, C1, and R1 that are also connected in series. As another example, the elements e4 thru e6 are connected in a shunt circuit form with respect to the elements e1 thru e3 to represent that the components L4, C4, and R4 are connected in a shunt circuit form with respect to the components L1, C1, and R1.

Figure 5A:
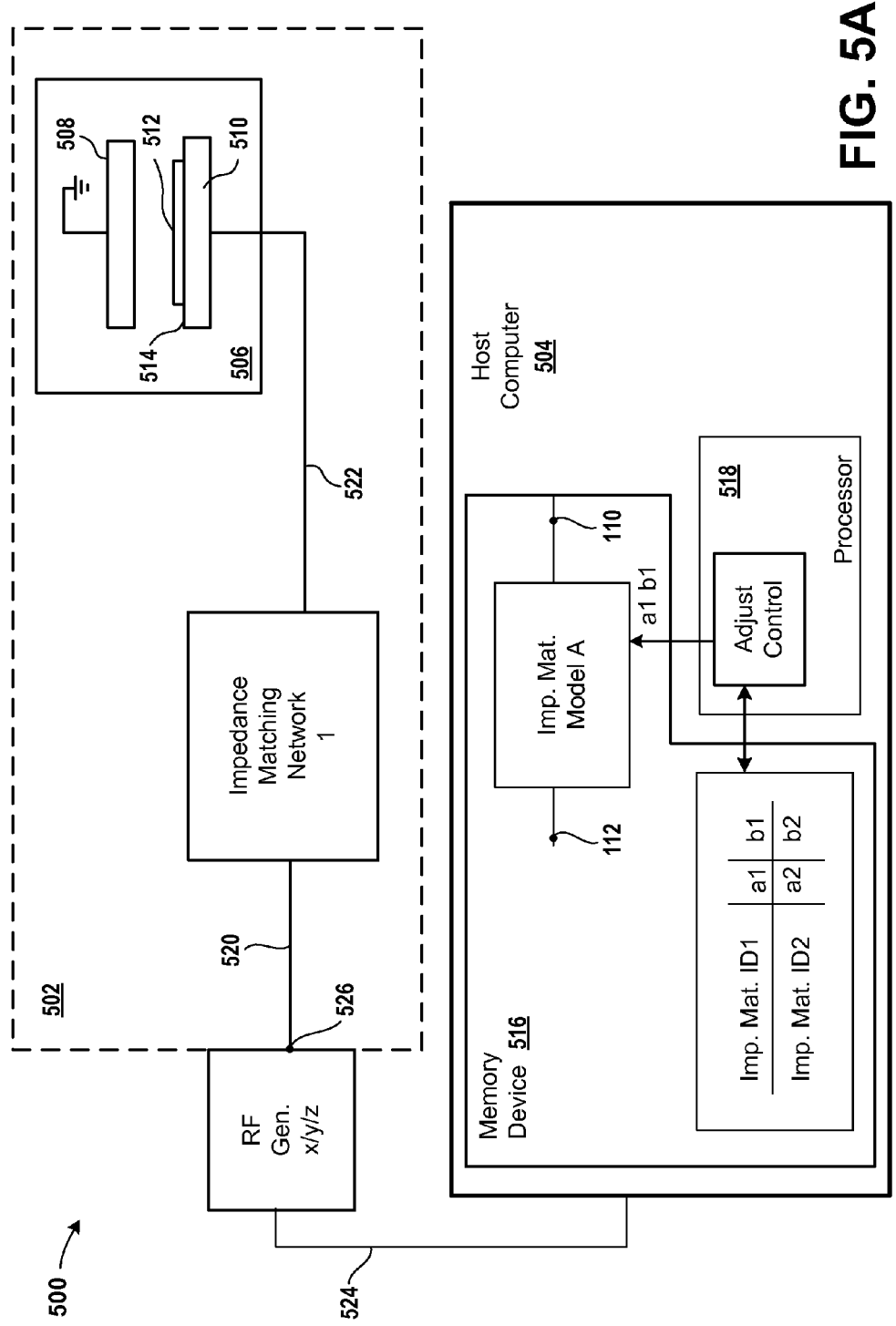
FIG. 5A is a diagram of a plasma system to illustrate providing characteristics a1 and b1 of the elements E1 and E2 when an impedance matching network 1 is connected within a plasma tool.

FIG. 5A is a diagram of a plasma system 500 to illustrate controlling characteristics of the elements E1 and E2 when the impedance matching network 1 is connected within a plasma tool 502. The plasma system 500 includes the plasma tool 502 and a host computer 504. Examples of the host computer 504 include a laptop computer or a desktop computer or a tablet or a smart phone, etc.

In one embodiment, instead of the host computer 504, a server or a virtual machine is used. For example, the server or virtual machine executes the same functions described herein as performed by the host computer 504.

The plasma tool 502 includes the x/y/z RF generator. The plasma tool 502 further includes the impedance matching network 1 and a plasma chamber 506. The plasma chamber 506 includes an upper electrode 508, a chuck 510, and a wafer 512. The upper electrode 508 faces the chuck 510 and is grounded, e.g., coupled to a reference voltage, coupled to zero voltage, coupled to a negative voltage, etc.

Examples of the chuck 510 include an electrostatic chuck (ESC) and a magnetic chuck. A lower electrode of the chuck 510 is made of a metal, e.g., anodized aluminum, alloy of aluminum, etc. Also, the upper electrode 508 is made of a metal, e.g., aluminum, alloy of aluminum, etc. The upper electrode 508 is located opposite to and facing the lower electrode of the chuck 510.

In one embodiment, the plasma chamber 506 is formed using additional parts, e.g., upper electrode extension that surrounds the upper electrode 508, a lower electrode extension that surrounds the chuck 510, a dielectric ring between the upper electrode 508 and the upper electrode extension, a dielectric ring between the lower electrode extension and the chuck 510, confinement rings located at edges of the upper electrode 508 and the chuck 510 to surround a region within the plasma chamber 506 in which plasma is formed, etc.

The wafer 512 is placed on a top surface 514 of the chuck 510 for processing, e.g., depositing materials on the wafer 512, or cleaning the wafer 512, or etching deposition layers on the wafer 512, or doping the wafer 512, or implantation of ions on the wafer 512, or creating a photolithographic pattern on the wafer 512, or etching the wafer 512, or sputtering the wafer 512, or a combination thereof.

A processor 518 of the host computer 504 accesses a recipe, e.g., an amount of pressure within the plasma chamber 506, a temperature within the plasma chamber 506, a gap between the upper electrode 508 and the chuck 510, an amount of process gas to be supplied within the plasma chamber 508, a frequency of an RF signal to be generated by the x/y/z RF generator, an amount of power of the RF signal, etc., from a memory device 516 of the host computer 504, and provides a portion, e.g., a frequency of an RF signal to be generated by the x/y/z RF generator, an amount of power of the RF signal, etc., of the recipe via a cable 524 and a communication device to the x/y/z RF generator.

Examples of the cable 524 connecting the host computer 504 to the x/y/z RF generator include a parallel cable that facilitates parallel transfer of data between the host computer 504 and the x/y/z RF generator or a serial cable that facilitates serial transfer of data between the host computer 504 and the x/y/z RF generator or a universal serial bus (USB) cable. Examples of the communication device that facilitates communication of data between the host computer 504 and the x/y/z RF generator include a communication device that facilitates parallel transfer of data between the host computer 504 and the x/y/z RF generator, or serial transfer of data between the host computer 504 and the x/y/z RF generator, or application of USB protocol to transfer data between the host computer 504 and the x/y/z RF generator.

The x/y/z RF generator receives the portion of the recipe and generates an RF signal having the frequency and power within the recipe portion. The impedance matching network 1 receives the RF signal from the x/y/z RF generator via an input, e.g., the input 407 (FIG. 4A), etc., of the impedance matching network 1 and matches an impedance of a load connected to an output of the impedance matching network 1 with that of a source connected to the input of the impedance matching network 1 to generate a modified RF signal. Examples of the source include the x/y/z RF generator and an RF cable 520 that couples the x/y/z RF generator to the impedance matching network 1. Examples of the load include an RF transmission line 522 and the plasma chamber 506. The RF transmission line 522 connects the lower electrode of the chuck 510 to the impedance matching network 1. The modified RF signal is provided by the impedance matching network 1 via the RF transmission line 522 to the chuck 510.

The chuck 510 receives the modified RF signal and upon entry of a process gas within the plasma chamber 506, plasma is stricken or maintained within the plasma chamber 506. Examples of the process gas include an oxygen-containing gas or a fluorine-containing gas, etc. and the process gas is provided between the upper electrode 508 and the chuck 510. The plasma is used to process the wafer 512.

The impedance matching model A is stored in the memory device 516 of the host computer 504. Moreover, the memory device 516 stores a database that includes an association between an identification of an impedance matching network and values of characteristics of elements of the impedance matching model for the impedance matching network. For example, the memory device 516 stores the ID1 of the impedance matching network 1, and a mapping between the ID1 and the characteristics a1 and b1 that are determined using a method described above with reference to FIG. 1B or 2B. Moreover, in this example, the memory device 516 stores the ID2 of the impedance matching network 1, and a mapping between the ID2 and the characteristics a2 and b2, which are determined using a method described above with reference to FIG. 1B or 2B.

The processor 518 of the host computer 504 receives an indication from the user via the input device and the input/output interface that the plasma tool 502 includes the impedance matching network 1. The processor 518 identifies from the memory device 516 that the ID1 of the impedance matching network 1 is associated with the characteristics a1 and b1 of the elements E1 and E2 of the impedance matching model A. The processor 518 accesses, e.g., reads, etc., the characteristics a1 and b1 from the memory device 516 and controls the impedance matching model A to adjust the characteristics of the elements E1 and E2 in the impedance matching model A to have the values a1 and b1.

When a parameter, e.g., complex voltage, complex current, complex impedance, complex power, etc., is received by the processor 518 via the communication device of the host computer 504 from a sensor that is connected to an output 526 of the x/y/z RF generator, the processor 518 applies the parameter to the input 112. The parameter is propagated by the processor 518 via the impedance matching model A to generate an output parameter at the output 110. For example, the processor 518 calculates a directional sum of a complex voltage received at the input 112 of the impedance matching model, a complex voltage across the element E1 determined using the characteristic a1, and a complex voltage across the element E2 determine using the characteristic b1. The complex voltage received at the input 112 is measured by the sensor connected to the output 526 of the x/y/z RF generator and is received from the sensor via a cable, e.g., a parallel transfer cable, a serial transfer cable, a USB cable, etc., or the complex voltage at the input 112 is received from the user via the input device connected to the processor and the I/O interface of the host computer. The processor 518 determines a complex voltage across the element E1 as a product of a complex current passing through the element E1 and a complex impedance of the element E1. The complex impedance of the element E1 is derived by the processor 518 from the characteristic of the element E1 and a frequency of the RF signal that is supplied by the x/y/z RF generator, and the complex current passing through the element E1 is the same as that of the RF signal that is supplied by the x/y/z RF generator. The processor 518 calculates a complex voltage at an output of the element E1 as a directional sum of the voltage of the RF signal that is supplied by the x/y/z RF generator and the complex voltage across the element E1. The processor 518 determines a complex voltage across the element E2 as a product of a complex current passing through the element E2 and a complex impedance of the element E2. The complex impedance of the element E2 is derived by the processor 518 from the characteristic of the element E2 and a frequency of the RF signal that is supplied by the x/y/z RF generator, and the complex current passing through the element E2 is the same as that of the RF signal that is supplied by the x/y/z RF generator. The processor 518 calculates a complex voltage at an output of the element E2 as a directional sum of the voltage at the output of the element E1 and the complex voltage across the element E2. The complex voltage at the output of the element E2 is further propagated by the processor 518 via the remaining elements E3 thru En (FIGS. 1B and 2B) to calculate complex voltage at the output 110 of the impedance matching model A.

The use of the impedance matching model A and the characteristics a1 and b1 facilitates generation of the output parameter at the output 110 that is reliable and specific for the impedance matching network 1. Moreover, the use of the impedance matching model A saves costs and time associated with coupling a sensor to a point between the output 526 of the x/y/z RF generator and the chuck 514 or coupling a sensor to the chuck 514 to measure a parameter. Instead of obtaining the measured parameter, a modeled parameter, e.g., the parameter at the output 110, etc., is obtained.

In one embodiment, the plasma chamber 506 and the RF transmission line 522 are sensitive to changes in temperature, or pressure, or corrosion during the pre-determined amount of time for which the load M or the load N is insensitive to changes in the temperature, or pressure, or corrosion. For example, there is aging, e.g., wear and tear, etc., of the plasma chamber 506 and the RF transmission line 522 with time. By using the load M to determine the characteristics a1, b1, a2 and b2 as described above with reference to FIGS. 1B and 2B, the characteristics are used to calculate one or more parameters at the output 110 of the impedance matching model A with accuracy and specificity.

Figure 5B:
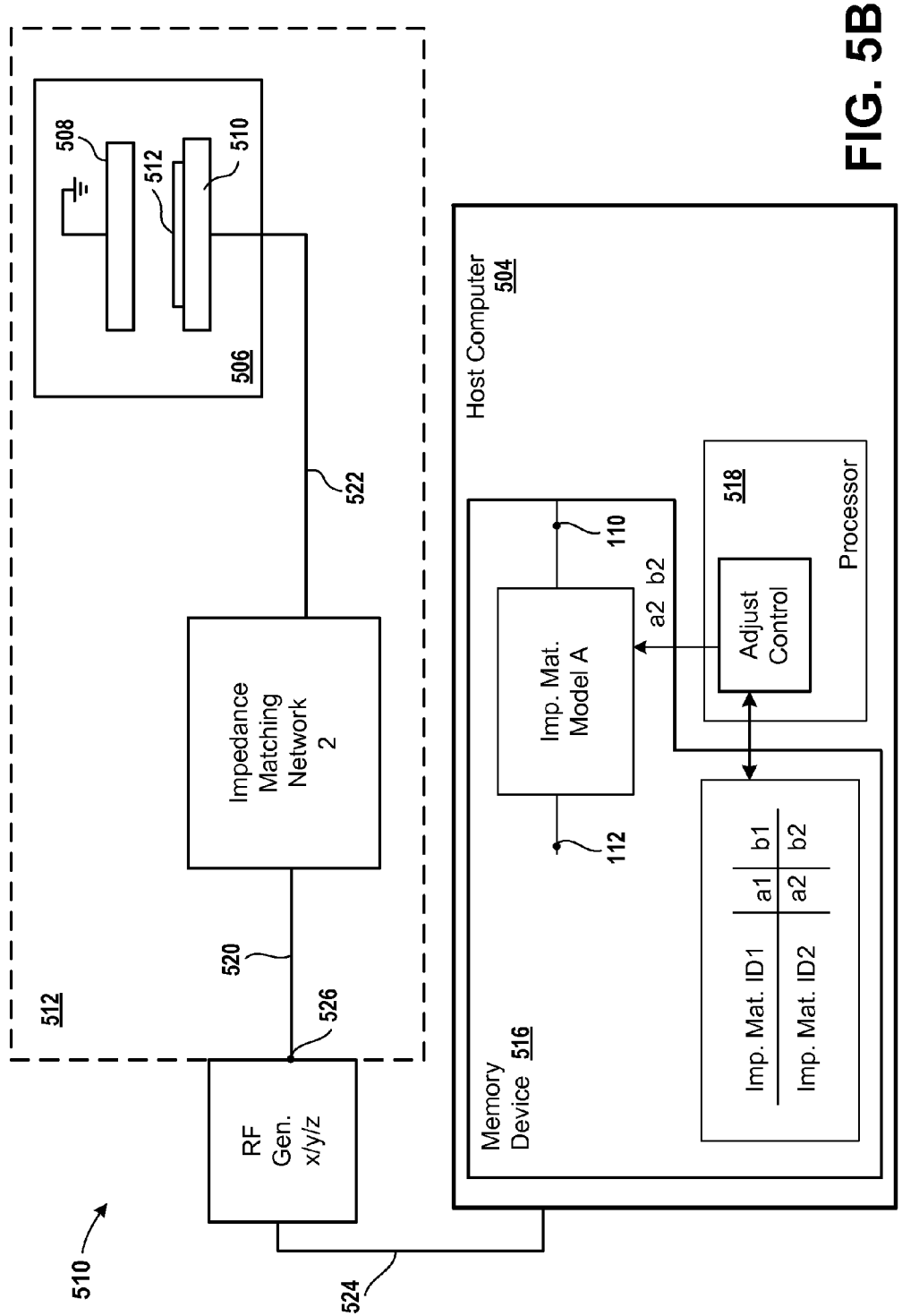
FIG. 5B is a diagram of an embodiment of a plasma system for illustrating provision of characteristics a2 and b2 when a plasma tool includes an impedance matching network 2.

FIG. 5B is a diagram of an embodiment of a plasma system 510 for illustrating use of the characteristics a2 and b2 by the processor 518 when a plasma tool 512 of the plasma system 510 includes the impedance matching network 2. The processor 518 provides a frequency and power of an RF signal to be generated by the x/y/z MHz RF generator. The x/y/z MHz RF generator generates the RF signal having the power and frequency and provides the RF signal via an input, e.g., the input 407 (FIG. 4A), etc., of the impedance matching network 2 to the impedance matching network 2. The impedance matching network 2 matches an impedance of a load, e.g., the plasma chamber 506 and the RF transmission line 522, etc., connected to an output, e.g., the output 409 (FIG. 4A), etc., of the impedance matching network 2 with that of a source, e.g., the x/y/z MHz RF generator and the RF cable 520, etc., connected to the input of impedance matching network 2 to generate a modified signal, which is used to strike or maintain plasma within the plasma chamber 506 as described above.

The processor 518 of the host computer 504 receives an indication from the user via the input device and the input/output interface that the plasma tool 502 includes impedance matching network 2. The processor 518 identifies from the memory device 516 that the ID2 of the impedance matching network 2 is associated with the characteristics a2 and b2 of the elements E1 and E2 of the impedance matching model A. The processor 518 accesses, e.g., reads, etc., the characteristics a2 and b2 from the memory device 516 and controls the impedance matching model A to adjust the characteristics of the elements E1 and E2 in the impedance matching model A to achieve the values a2 and b2.

When a parameter is received by the processor 518 via the communication device of the host computer 504 from a sensor that is connected to the output 526 of the x/y/z RF generator, the processor 518 applies the parameter to the input 112. The parameter is propagated by the processor 518 via the impedance matching model A to generate an output parameter at the output 110. For example, in a manner similar to that described above with reference to FIG. 5A, the processor 518 calculates a directional sum of a complex voltage received at the input 112 of the impedance matching model, a complex voltage across the element E1 determined using the characteristic a2 and a frequency of an RF signal supplied by the x/y/z generator, and a complex voltage across the element E2 determined using the characteristic b2 and a frequency of an RF signal supplied by the x/y/z generator to calculate a complex voltage at the output 110 of the impedance matching model A. The complex voltage received at the input 112 is measured by the sensor connected to the output 526 of the x/y/z RF generator and is received from the sensor via a cable, e.g., a parallel transfer cable, a serial transfer cable, a USB cable, etc., or the complex voltage at the input 112 is received from the user via the input device connected to the processor and the I/O interface of the host computer.

The use of the impedance matching model A and the characteristics a2 and b2 facilitates generation of the parameter at the output 110 that is reliable and specific for the impedance matching network 2. Also, when the impedance matching network 1 is decoupled from the RF transmission line 522 and the RF cable 520 and the impedance matching network 2 is coupled to the RF transmission line 522 and the RF cable 520, there is no need to tune the impedance matching model A for generation of the characteristics a2 and b2. The processor 518 identifies the ID2 of the impedance matching network 2 and adjusts the elements E1 and E2 to have the values a2 and b2 instead of the values a1 and b1. The adjustment by the processor 518 saves times associated with a delay during processing of the wafer 512. The delay is for tuning the impedance matching model A to generate the characteristics a2 and b2 for the impedance matching 2.

Figure 5C:
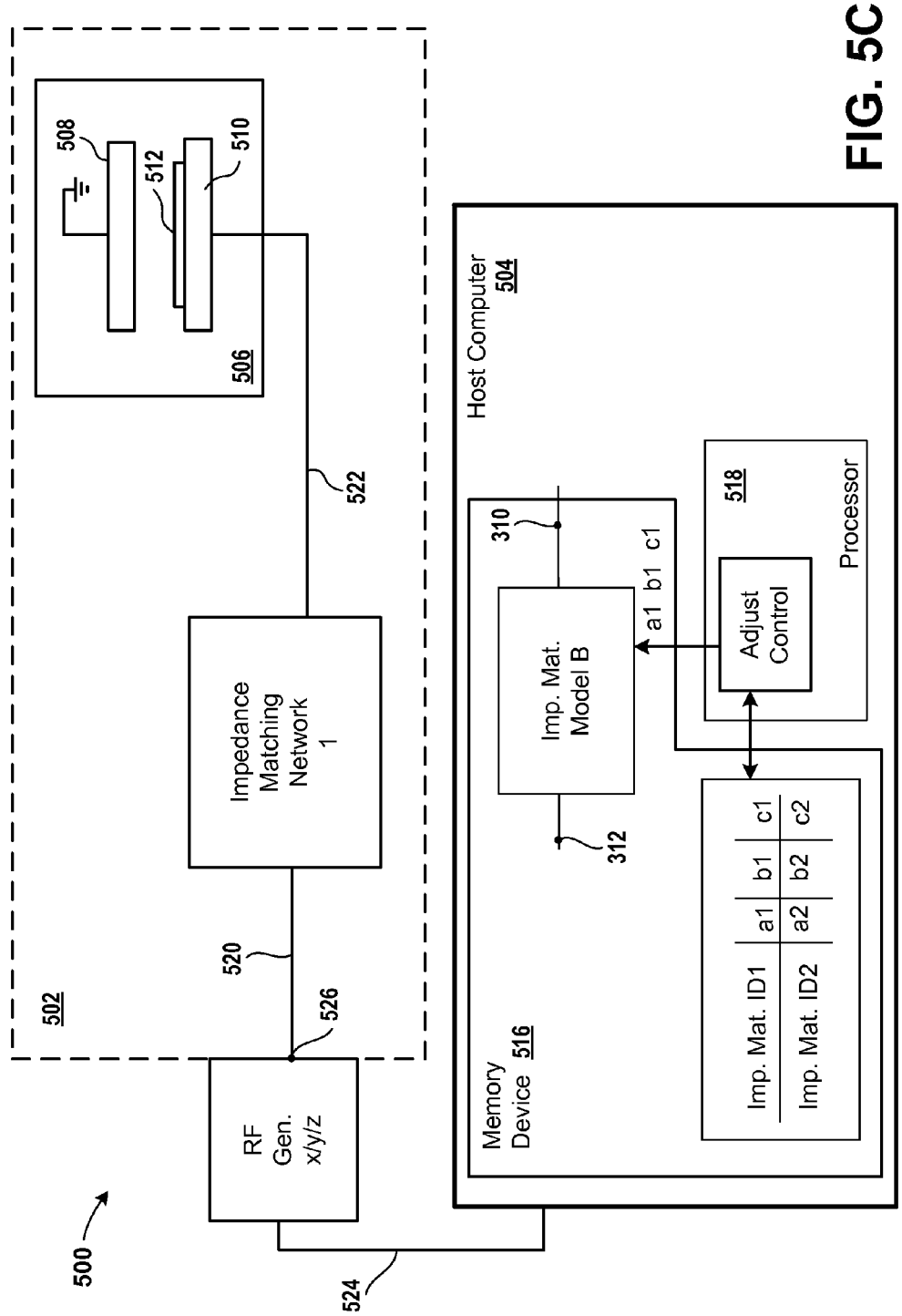
FIG. 5C is a diagram of an embodiment of a plasma system to illustrate provision of characteristics a1, b1, and c1 when the impedance matching network 1 is used in a plasma tool.

FIG. 5C is a diagram of an embodiment of the plasma system 500 to illustrate use of the characteristics a1, b1, and c1 when the impedance matching network 1 is used in the plasma tool 502. The impedance matching model B is stored in the memory device 516 of the host computer 504. Moreover, the memory device 516 of the host computer 504 stores a database that includes an association between an identification of an impedance matching network and values of characteristics of elements of the impedance matching model for the impedance matching network. For example, the memory device 516 stores the ID1 of the impedance matching network 1, and a mapping between the ID1 and the characteristics a1, b1, and c1 that are determined using a method described above with reference to FIG. 3B. Moreover, in this example, the memory device 516 stores the ID2 of the impedance matching network 2, and a mapping between the ID2 and the characteristics a2, b2, and c2 that are determined using a method described above with reference to FIG. 3B.

The processor 518 of the host computer 504 receives an indication from the user via the input device and the input/output interface that the plasma tool 502 includes the impedance matching network 1. The processor 518 identifies from the memory device 516 that the ID1 of the impedance matching network 1 is associated with the characteristics a1, b1, and c1 of the elements E1, E2, and E3 of the impedance matching model A. The processor 518 accesses, e.g., reads, etc., the characteristics a1, b1, and c1 from the memory device 516 and controls the impedance matching model B to adjust the characteristics of the elements E1, E2, and E3 in the impedance matching model B to have the values a1, b1, and c1.

When a parameter, e.g., complex voltage, complex current, complex impedance, complex power, etc., is received by the processor 518 via the communication device of the host computer 504 from a sensor that is connected to the output 526 of the x/y/z RF generator, the processor 518 applies the parameter to the input 112. The parameter is propagated by the processor 518 via the impedance matching model B to generate an output parameter at the output 310 of the impedance matching model B. For example, the processor 518 calculates a directional sum of a complex voltage received at the input 312 of the impedance matching model B, a complex voltage across the element E1 determined using the characteristic a1, a complex voltage across the element E2 determined using the characteristic b1, and a complex voltage across the element E3 determined using the characteristic c1. The processor 518 determines a complex voltage across the element E1 and a complex voltage across the element E2 in a manner described above to calculate a complex voltage at the output of the element E2.

Moreover, the processor 518 determines a complex voltage across the element E3 as a product of a complex current passing through the element E3 and a complex impedance of the element E3. The complex voltage of the element E3 is derived by the processor 518 from the characteristic of the element E3 and a frequency of an RF signal supplied by the x/y/z RF generator, and the complex current passing through the element E3 is the same as that of the RF signal that is supplied by the x/y/z RF generator. The processor 518 calculates a complex voltage at an output of the element E3 as a directional sum of the voltage at the output of the element E2 and the complex voltage across the element E3. The complex voltage at the output of the element E3 is further propagated by the processor 518 via the remaining elements E4 thru En (FIG. 3B) to calculate complex voltage at the output 310 of the impedance matching model B.

The use of the impedance matching model B and the characteristics a1, b1, and c1 facilitate generation of the output parameter at the output 310 that is reliable and specific for the impedance matching network 1. Moreover, the use of the impedance matching model B saves costs and time associated with coupling a sensor to a point between the output 526 of the x/y/z RF generator and the chuck 514 or coupling a sensor to the chuck 514.

Figure 5D:
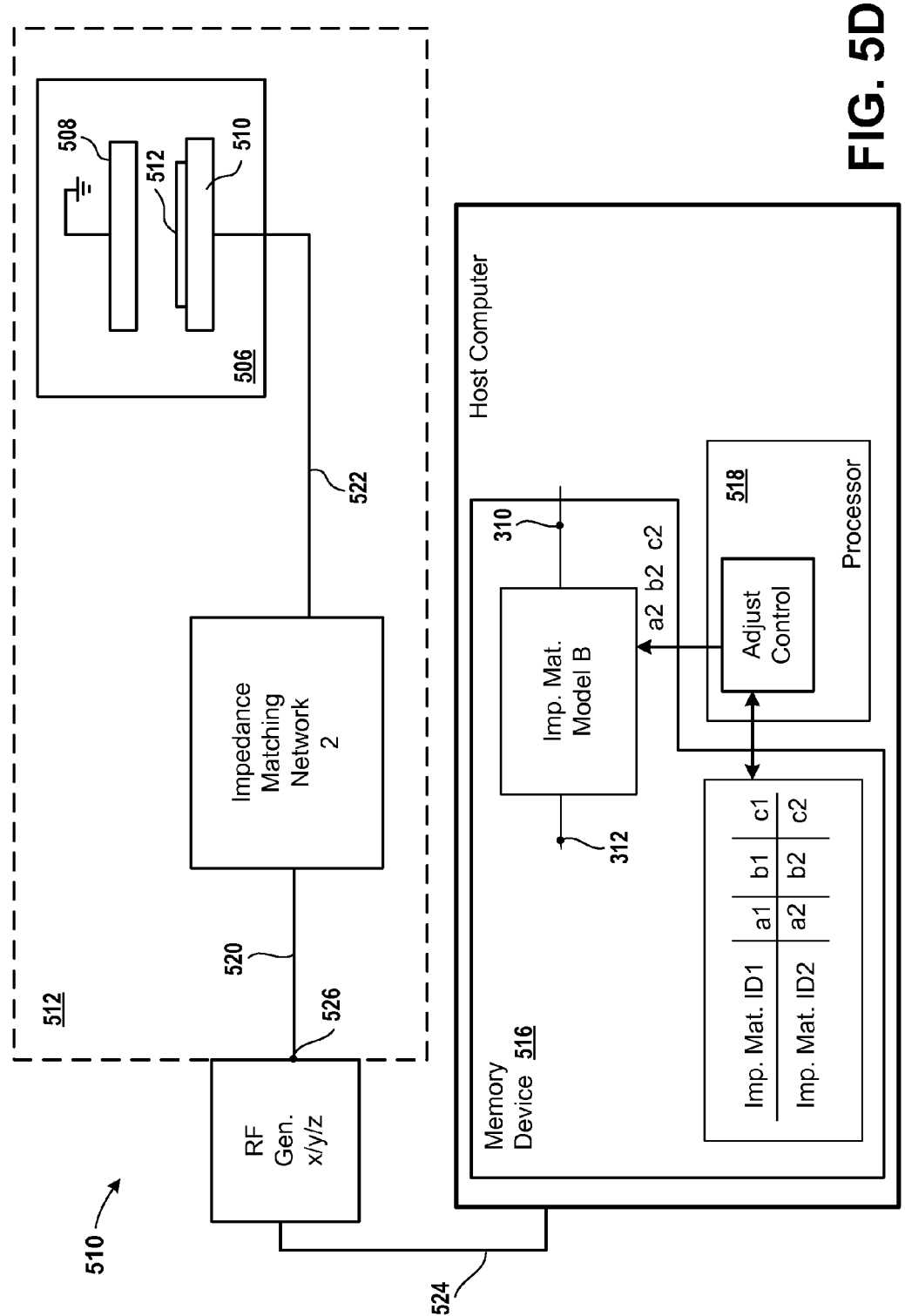
FIG. 5D is a diagram of an embodiment of a plasma system for illustrating provision of characteristics a2, b2, and c2 when a plasma tool includes the impedance matching network 2.

FIG. 5D is a diagram of an embodiment of the plasma system 510 for illustrating use of the characteristics a2, b2, and c2 by the processor 518 when the plasma tool 512 includes the impedance matching network 2. The processor 518 of the host computer 504 receives an indication from the user via the input device connected to the processor 518 and the input/output interface of the host computer 504 that the plasma tool 502 includes the impedance matching network 2. The processor 518 identifies from the memory device 516 that the ID2 of the impedance matching network 2 is associated with the characteristics a2, b2, and c2 of the elements E1, E2, and E3 of the impedance matching model B. The processor 518 accesses, e.g., reads, etc., the characteristics a2, b2, and c2 from the memory device 516 and controls the impedance matching model B to adjust the characteristics of the elements E1, E2, and E3 in the impedance matching model B to achieve the values a2, b2, and c2.

When a parameter is received by the processor 518 via the communication device of the host computer 504 from a sensor that is connected to the output 526 of the x/y/z RF generator, the processor 518 applies the parameter to the input 312. The parameter is propagated by the processor 518 via the impedance matching model B to generate an output parameter at the output 310. For example, in a manner similar to that described above with reference to FIG. 5C, the processor 518 calculates a directional sum of a complex voltage received at the input 312 of the impedance matching model, a complex voltage across the element E1 determined using the characteristic a2 and a frequency of an RF signal supplied by the x/y/z RF generator, a complex voltage across the element E2 determined using the characteristic b2 and the frequency of the RF signal supplied by the x/y/z RF generator, and a complex voltage across the element E3 determined using the characteristic c2 and the frequency of an RF signal supplied by the x/y/z RF generator to calculate a complex voltage at the output 310 of the impedance matching model B.

The use of the impedance matching model B and the characteristics a2, b2, and c2 facilitates generation of the output parameter at the output 310 that is reliable and specific for the impedance matching network 2. For example, when the impedance matching network 1 is decoupled from the RF transmission line 522 at an input, e.g., the input 407 (FIG. 4A), etc., of the impedance matching network 1 and is decoupled from the RF cable 520 at an output, e.g., the output 409 (FIG. 4A), etc., of the impedance matching network 1, and the impedance matching network 2 is coupled to the RF transmission line 522 via an input, e.g., the input 407, etc. of the impedance matching network 2 and is coupled to the RF cable 520 via an output, e.g., the output 409, etc., of the impedance matching network 2, there is no need to tune the impedance matching model B for generation of the characteristics a2, b2, and c2. The processor 518 identifies the ID2 of the impedance matching network 2 and adjusts the elements E1 and E2 to have the values a2, b2, and c2 instead of the values a1, b1, and c1. The adjustment by the processor 518 saves times associated with a delay during processing of the wafer 512. The delay is for tuning the impedance matching model A to generate the characteristics a2, b2, and c2 for the impedance matching network 2.

Figure 6:
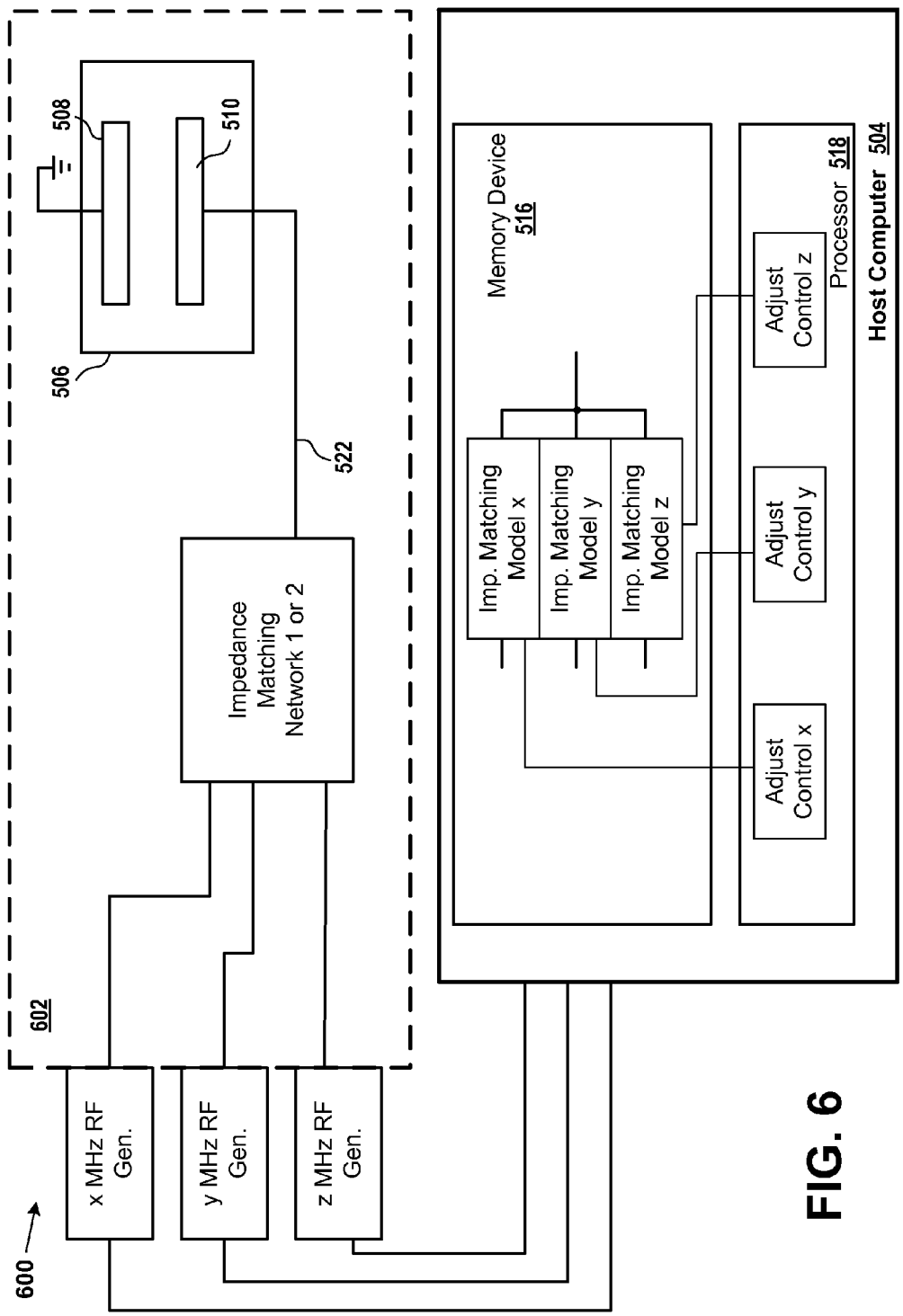
FIG. 6 is a diagram of an embodiment of a system to illustrate that multiple adjust controls are applied when multiple RF generators are operated simultaneously.

FIG. 6 is a diagram of an embodiment of a system 600 to illustrate that multiple adjust controls x, y, and z are applied by the processor 518 when multiple RF generators, e.g., the x MHz RF generator, the y MHz RF generator, and the z MHz RF generator, etc., are operated simultaneously. All the x, y, and z MHz RF generators are supplying RF signals at the same time to the impedance matching network 1. The impedance matching network 1 matches an impedance of a load, e.g., the plasma chamber 506 and the RF transmission line 522, etc., with an impedance of a source, e.g., the x, y, and z MHz RF generators, and RF cables that connect the RF generators to the impedance matching network 1 to generate a modified signal. The modified signal is provided to the plasma chamber 506 to generate or maintain plasma within the plasma chamber 506.

An impedance matching model x, an impedance matching model y, and an impedance matching model z are stored in the memory device 516. The impedance matching model A or B is an example of the impedance matching model x when the x/y/z RF generator is the x MHz RF generator. Moreover, the impedance matching model A or B is an example of the impedance matching model y when the x/y/z RF generator is the y MHz RF generator. Also, the impedance matching model A or B is an example of the impedance matching model z when the x/y/z RF generator is the z MHz RF generator.

The processor 518 executes logic that is represented by an adjust control x, logic that is represented by an adjust control y, and/or logic that is represented by an adjust control z. Upon determining, by the adjust control x that the impedance matching network 1 is included within a plasma tool 602 and that the x MHz RF generator is supplying an RF signal, the adjust control x identifies from a mapping between the ID1 and characteristics associated with the ID1, the characteristics to control values of elements of the impedance matching model x. For example, the processor 518 provides the characteristics a1 and b1 or the characteristics a1, b1, and c1 to the impedance matching model x. In this example, the characteristics a1 and b1 are measured using the system of FIG. 1A or 2A when the network analyzer 102 generates an RF signal of a frequency corresponding to the x MHz RF generator. Also, in this example, the characteristics a1, b1, and c1 are measured using the system of FIG. 3A when the network analyzer 102 generates an RF signal of a frequency corresponding to the x MHz RF generator. An illustration of a frequency corresponding to the x MHz RF generator is a frequency that is within a pre-determined range, e.g., within 0.5 MHz, etc., from 2 MHz or within a pre-determined range, e.g., within 50 kHz, etc., from 400 kHz.

On the other hand, upon determining, by the adjust control x that the impedance matching network 2 is included within the plasma tool 602 and that the x MHz RF generator is supplying an RF signal, the adjust control x identifies from a mapping between the ID2 and characteristics associated with the ID2, the characteristics to control values of elements of the impedance matching model x. For example, the processor 518 provides the characteristics a2 and b2 or the characteristics a2, b2, and c2 to the impedance matching model x. In this example, the characteristics a2 and b2 are measured using the system of FIG. 1A or 2A when the network analyzer 102 generates an RF signal of the frequency corresponding to the x MHz RF generator. Also, in this example, the characteristics a2, b2, and c2 are measured using the system of FIG. 3A when the network analyzer 102 generates an RF signal of the frequency corresponding to the x MHz RF generator.

Upon determining, by the adjust control y that the impedance matching network 1 is included within a plasma tool 602 and that the y MHz RF generator is supplying an RF signal, the adjust control y identifies from a mapping between the ID1 and characteristics associated with the ID1, the characteristics to control values of elements of the impedance matching model y. For example, the processor 518 provides the characteristics a1 and b1 to the impedance matching model y. In this example, the characteristics a1 and b1 are measured using the system of FIG. 1A or 2A when the network analyzer 102 generates an RF signal of a frequency corresponding to the y MHz RF generator. Moreover, as another example, the processor 518 provides the characteristics a1, b1, and c1 to the impedance matching model y. In this example, the characteristics a1, b1, and c1 are measured using the system of FIG. 3A when the network analyzer 102 generates an RF signal of a frequency corresponding to the y MHz RF generator. An illustration of a frequency corresponding to the y MHz RF generator is a frequency that is within a pre-determined range, e.g., within 2 MHz, etc., from 27 kHz.

On the other hand, upon determining, by the adjust control y that the impedance matching network 2 is included within the plasma tool 602 and that the y MHz RF generator is supplying an RF signal, the adjust control y identifies from a mapping between the ID2 and characteristics associated with the ID2, the characteristics to control values of elements of the impedance matching model y. For example, the processor 518 provides the characteristics a2 and b2 or the characteristics a2, b2, and c2 to the impedance matching model y. In this example, the characteristics a2 and b2 are measured using the system of FIG. 1A or 2A when the network analyzer 102 generates an RF signal of the frequency corresponding to the y MHz RF generator. Also, in this example, the characteristics a2, b2, and c2 are measured using the system of FIG. 3A when the network analyzer 102 generates an RF signal of the frequency corresponding to the y MHz RF generator.

Also, upon determining, by the adjust control z that the impedance matching network 1 is included within a plasma tool 602 and that the z MHz RF generator is supplying an RF signal, the adjust control z identifies from a mapping between the ID1 and characteristics associated with the ID1, the characteristics to control values of elements of the impedance matching model z. For example, the processor 518 provides the characteristics a1 and b1 to the impedance matching model z. In this example, the characteristics a1 and b1 are measured using the system of FIG. 1A or 2A when the network analyzer 102 generates an RF signal of a frequency corresponding to the z MHz RF generator. Moreover, as another example, the processor 518 provides the characteristics a1, b1, and c1 to the impedance matching model z. In this example, the characteristics a1, b1, and c1 are measured using the system of FIG. 3A when the network analyzer 102 generates an RF signal of a frequency corresponding to the z MHz RF generator. An illustration of a frequency corresponding to the z MHz RF generator is a frequency that is within a pre-determined range, e.g., within 5 MHz, etc., from 60 MHz.

On the other hand, upon determining, by the adjust control z that the impedance matching network 2 is included within the plasma tool 602 and that the z MHz RF generator is supplying an RF signal, the adjust control z identifies from a mapping between the ID2 and characteristics associated with the ID2, the characteristics to control values of elements of the impedance matching model z. For example, the processor 518 provides the characteristics a2 and b2 or the characteristics a2, b2, and c2 to the impedance matching model z. In this example, the characteristics a2 and b2 are measured using the system of FIG. 1A or 2A when the network analyzer 102 generates an RF signal of the frequency corresponding to the z MHz RF generator. Also, in this example, the characteristics a2, b2, and c2 are measured using the system of FIG. 3A when the network analyzer 102 generates an RF signal of the frequency corresponding to the z MHz RF generator.

In one embodiment, an indication that an RF signal is supplied by an RF generator is sent from a digital signal processor (DSP) of the RF generator via a cable and a communication device of the host computer 504 to the processor 518 of the host computer 504. The cable connects the RF generator to the host computer 504.

It should be noted that the x/y/z RF generator includes a communication device, which is similar or the same as the communication device of the host computer 504, to facilitate communication between the x/y/z RF generator and the host computer 504.

In one embodiment, instead of three RF generators, any other number of RF generators is used within the system 600 to supply RF signals. For example, instead of the x, y, and z RF generators, the x and y RF generators are used, or the y and z RF generators are used, or the x and z RF generators are used. In this embodiment, instead of executing the adjust controls x, y, and z, the number of adjust controls used is equal to the number of RF generators. For example, when the x and y RF generators are used, the adjust controls x and y are used. As another example, when the y and z RF generators are used, the adjust controls y and z are used.

Figure 7:
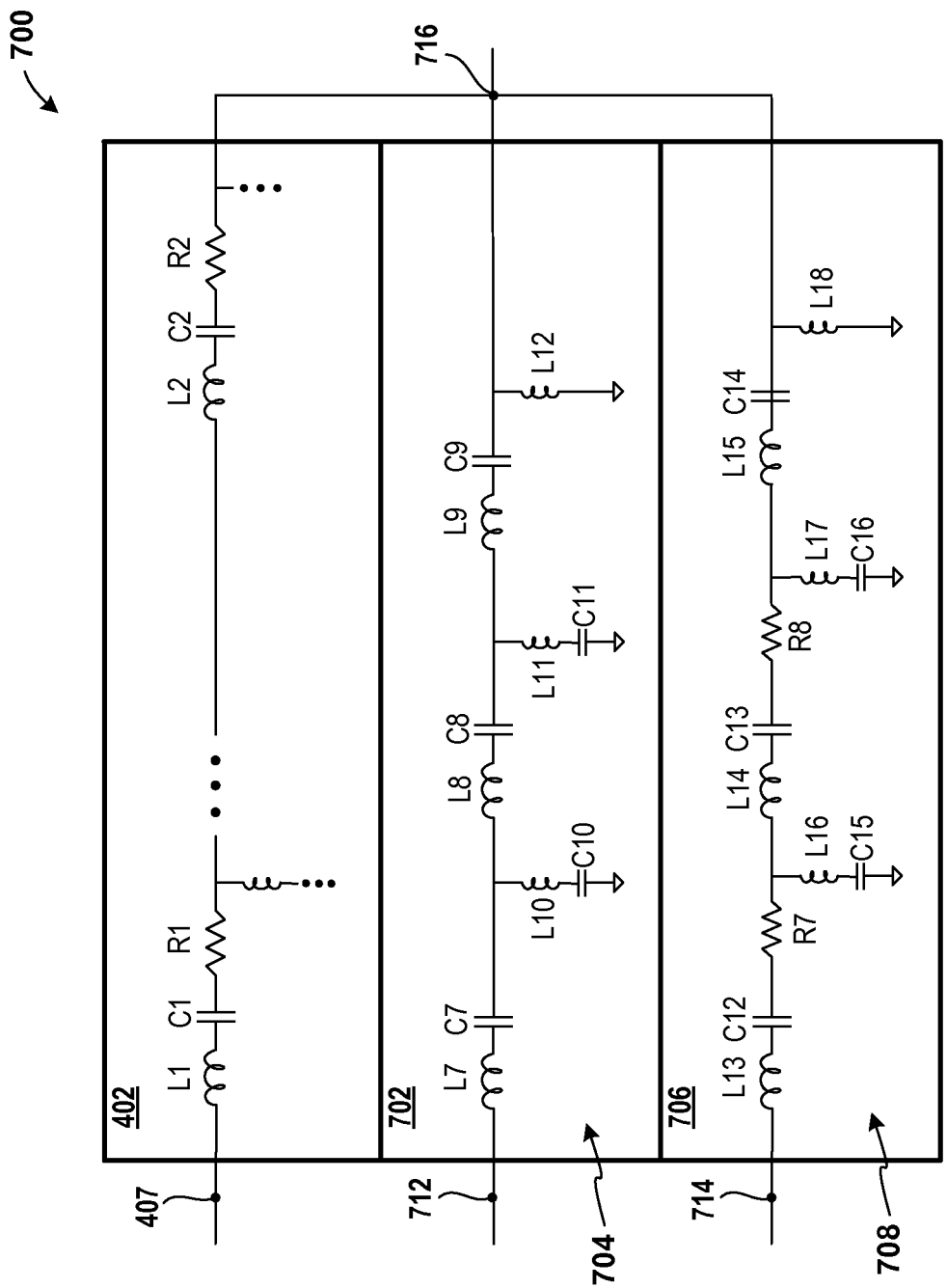
FIG. 7 is a diagram of an embodiment of a topography of an impedance matching network.

FIG. 7 is a diagram of an embodiment of a topography of the impedance matching network 700. The impedance matching network 700 is an example of any of the impedance matching networks 1 thru 10. For example, the impedance matching network 700 includes the impedance matching network portion 402, an impedance matching network portion 702, and an impedance matching network portion 708. Each portion 402, 702, and 708 is sometimes referred to herein as a section of the impedance matching network 702. The impedance matching network portion 402 connects via the input 407 to the x MHz RF generator, the impedance matching network portion 702 connects via an input 712 to the y MHz RF generator, and the impedance matching network portion 706 connects via an input 714 to the z MHz RF generator.

The impedance matching network portion 702 has a topology 704. For example, the impedance matching network portion 702 includes inductors L7, L8, L9, L10, L11, and L12, and includes capacitors C7, C8, C9, C10, and C11. The inductors L7, L8, L9, L10, L11, and L12 and capacitors C7, C8, C9, C10, and C11 are arranged to be connected with each other in the manner illustrated in FIG. 7.

Similarly, the impedance matching network portion 706 has a topology 708. For example, the impedance matching network portion 702 includes inductors L13, L14, L15, L16, L17, and L18, includes capacitors C12, C13, C14, C15, and C16, and includes resistors R7 and R8. The inductors L13, L14, L15, L16, L17, and L17, the capacitors C12, C13, C14, C15, and C16, and the resistors R7 and R8 are arranged to be connected with each other in the manner illustrated in FIG. 7. The impedance matching network 700 is connected to the RF transmission line 522 (FIG. 5A) at an output 716.

In an embodiment, a topography of the impedance matching network 700 is a number of circuit components, e.g., inductors, resistors, capacitors, etc., within the impedance matching network 700 and connections between the circuit components. For example, the inductor L7 is connected in series with the capacitor C7. Moreover, the inductor L10 and the capacitor C10 are connected in a shunt form with respect to the series connection of the inductor L7 and the capacitor C7.

In one embodiment, each impedance matching network portion includes any number of resistors, and/or any number of capacitors, and/or any number of inductors.

Figure 8:
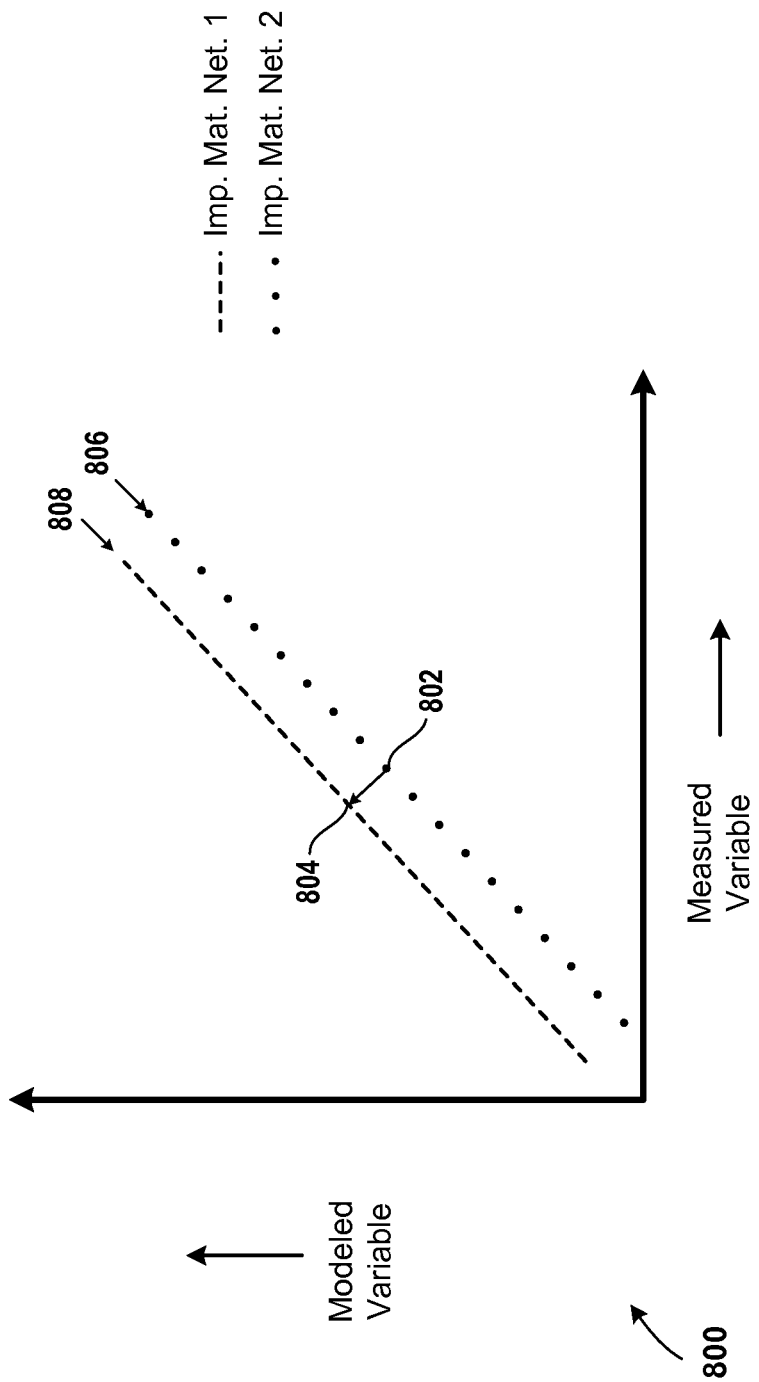
FIG. 8 is a diagram of an embodiment of a graph to illustrate that a determination and use of characteristics of elements for various impedance matching networks results in uniformity of a variable that is measured at outputs of the impedance matching networks.

FIG. 8 is a diagram of an embodiment of a graph 800 to illustrate that the determination and use of characteristics of elements for various impedance matching networks result in uniformity of a variable that is modeled at an output of an impedance matching model that represents the impedance matching networks. The graph 800 plots a modeled variable versus a measured variable. Examples of a variable include power, or current, or voltage. The graph 800 plots a modeled variable versus measured variable for the impedance matching networks 1 and 2 for various recipes, e.g., combinations of pressures within the plasma chamber 506, temperatures within the plasma chamber 506, gaps between the lower electrode and the upper electrode, powers of RF signals supplied by RF generators, etc. Each point or each dash in graph 800 is associated with one recipe.

An example of the modeled variable is a parameter calculated at the output 110 (FIG. 1B or 2B) of the impedance matching model A or at the output 310 (FIG. 3B) of the impedance matching model B. An example of the measured variable is a variable measured using a sensor at the output 409 of the impedance matching network portion 402 (FIG. 4A) or at the output 716 of the impedance matching network 700 (FIG. 7).

When the characteristics a2 and b2 or the characteristics a2, b2, and c2 are used with the impedance matching network 2 and the characteristics a1 and b1 or the characteristics a1, b1, and c1 are used with the impedance matching network 1, a point 802 on the graph 800 shifts to coincide with a dash 804 on the graph 800. When the point 802 shifts to coincide with the dash 804, a line 806 representing a behavior of the impedance matching network 2 for different recipes coincides with a line 808 representing a behavior of the impedance matching network 1 for the different recipes.

It should be noted that in some of the above-described embodiments, an RF supply signal is provided to the lower electrode of the chuck 510 (FIG. 5A) and the upper electrode 508 (FIG. 5A) is grounded. In various embodiments, an RF supply signal is provided to the upper electrode 508 and the lower electrode of the chuck 510 is grounded.

Embodiments, described herein, may be practiced with various computer system configurations including hand-held hardware units, microprocessor systems, microprocessor-based or programmable consumer electronics, minicomputers, mainframe computers and the like. The embodiments, described herein, can also be practiced in distributed computing environments where tasks are performed by remote processing hardware units that are linked through a computer network.

In some embodiments, a controller is part of a system, which may be part of the above-described examples. The system includes semiconductor processing equipment, including a processing tool or tools, chamber or chambers, a platform or platforms for processing, and/or specific processing components (a wafer pedestal, a gas flow system, etc.). The system is integrated with electronics for controlling its operation before, during, and after processing of a semiconductor wafer or substrate. The electronics is referred to as the "controller," which may control various components or subparts of the system. The controller, depending on processing requirements and/or a type of the system, is programmed to control any process disclosed herein, including a delivery of process gases, temperature settings (e.g., heating and/or cooling), pressure settings, vacuum settings, power settings, RF generator settings, RF matching circuit settings, frequency settings, flow rate settings, fluid delivery settings, positional and operation settings, wafer transfers into and out of a tool and other transfer tools and/or load locks connected to or interfaced with the system.

Broadly speaking, in a variety of embodiments, the controller is defined as electronics having various integrated circuits, logic, memory, and/or software that receive instructions, issue instructions, control operation, enable cleaning operations, enable endpoint measurements, and the like. The integrated circuits include chips in the form of firmware that store program instructions, DSPs, chips defined as ASICs, PLDs, one or more microprocessors, or microcontrollers that execute program instructions (e.g., software). The program instructions are instructions communicated to the controller in the form of various individual settings (or program files), defining operational parameters for carrying out a process on or for a semiconductor wafer. The operational parameters are, in some embodiments, a part of a recipe defined by process engineers to accomplish one or more processing steps during the fabrication of one or more layers, materials, metals, oxides, silicon, silicon dioxide, surfaces, circuits, and/or dies of a wafer.

The controller, in some embodiments, is a part of or coupled to a computer that is integrated with, coupled to the system, otherwise networked to the system, or a combination thereof. For example, the controller is in a "cloud" or all or a part of a fab host computer system, which allows for remote access for wafer processing. The controller enables remote access to the system to monitor current progress of fabrication operations, examines a history of past fabrication operations, examines trends or performance metrics from a plurality of fabrication operations, to change parameters of current processing, to set processing steps to follow a current processing, or to start a new process.

In some embodiments, a remote computer (e.g. a server) provides process recipes to the system over a computer network, which includes a local network or the Internet. The remote computer includes a user interface that enables entry or programming of parameters and/or settings, which are then communicated to the system from the remote computer. In some examples, the controller receives instructions in the form of settings for processing a wafer. It should be understood that the settings are specific to a type of process to be performed on a wafer and a type of tool that the controller interfaces with or controls. Thus as described above, the controller is distributed, such as by including one or more discrete controllers that are networked together and working towards a common purpose, such as the fulfilling processes described herein. An example of a distributed controller for such purposes includes one or more integrated circuits on a chamber in communication with one or more integrated circuits located remotely (such as at a platform level or as part of a remote computer) that combine to control a process in a chamber.

Without limitation, in various embodiments, the system includes a plasma etch chamber, a deposition chamber, a spin-rinse chamber, a metal plating chamber, a clean chamber, a bevel edge etch chamber, a physical vapor deposition (PVD) chamber, a chemical vapor deposition (CVD) chamber, an atomic layer deposition (ALD) chamber, an atomic layer etch (ALE) chamber, an ion implantation chamber, a track chamber, and any other semiconductor processing chamber that is associated or used in fabrication and/or manufacturing of semiconductor wafers.

It is further noted that although the above-described operations are described with reference to a parallel plate plasma chamber, e.g., a capacitively coupled plasma chamber, etc., in some embodiments, the above-described operations apply to other types of plasma chambers, e.g., a plasma chamber including an inductively coupled plasma (ICP) reactor, a transformer coupled plasma (TCP) reactor, conductor tools, dielectric tools, a plasma chamber including an electron cyclotron resonance (ECR) reactor, etc. For example, the x MHz RF generator, the y MHz RF generator, and the z MHz RF generator are coupled to an inductor within the ICP plasma chamber.

As noted above, depending on a process operation to be performed by the tool, the controller communicates with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

With the above embodiments in mind, it should be understood that some of the embodiments employ various computer-implemented operations involving data stored in computer systems. These computer-implemented operations are those that manipulate physical quantities.

Some of the embodiments also relate to a hardware unit or an apparatus for performing these operations. The apparatus is specially constructed for a special purpose computer. When defined as a special purpose computer, the computer performs other processing, program execution or routines that are not part of the special purpose, while still being capable of operating for the special purpose.

In some embodiments, the operations, described herein, are performed by a computer selectively activated, or are configured by one or more computer programs stored in a computer memory, or are obtained over a computer network. When data is obtained over the computer network, the data may be processed by other computers on the computer network, e.g., a cloud of computing resources.

One or more embodiments, described herein, can also be fabricated as computer-readable code on a non-transitory computer-readable medium. The non-transitory computer-readable medium is any data storage hardware unit, e.g., a memory device, etc., that stores data, which is thereafter read by a computer system. Examples of the non-transitory computer-readable medium include hard drives, network attached storage (NAS), ROM, RAM, compact disc-ROMs (CD-ROMs), CD-recordables (CD-Rs), CD-rewritables (CD-RWs), magnetic tapes and other optical and non-optical data storage hardware units. In some embodiments, the non-transitory computer-readable medium includes a computer-readable tangible medium distributed over a network-coupled computer system so that the computer-readable code is stored and executed in a distributed fashion.

Although some method operations, described above, were presented in a specific order, it should be understood that in various embodiments, other housekeeping operations are performed in between the method operations, or the method operations are adjusted so that they occur at slightly different times, or are distributed in a system which allows the occurrence of the method operations at various intervals, or are performed in a different order than that described above.

It should further be noted that in an embodiment, one or more features from any embodiment described above are combined with one or more features of any other embodiment without departing from a scope described in various embodiments described in the present disclosure.

Although the foregoing embodiments have been described in some detail for purposes of clarity of understanding, it will be apparent that certain changes and modifications can be practiced within the scope of appended claims. Accordingly, the present embodiments are to be considered as illustrative and not restrictive, and the embodiments are not to be limited to the details given herein, but may be modified within the scope and equivalents of the appended claims.

The invention claimed is:

1. A method comprising:
receiving a reference impedance, wherein the reference impedance is measured for a frequency operating range of a sensor and for a position range associated with one or more reference variable capacitors within a reference impedance matching network that is coupled to a load, wherein the load has an impedance;
accessing an impedance matching model;
when the load impedance is applied at an output of the impedance matching model, generating a set of reference characteristics of pre-determined elements of the impedance matching model to achieve the reference impedance at an input of the impedance matching model;
receiving a test impedance, wherein the test impedance is measured for the frequency operating range of the sensor and for the position range associated with one or more test variable capacitors within a test impedance matching network coupled to the load, wherein the reference impedance matching network has a same arrangement of components as that of the test impedance matching network;
when the load impedance is applied at the output of the impedance matching model, generating a set of test characteristics of the pre-determined elements of the impedance matching model to achieve the test impedance at the input of the impedance matching model;
determining whether information indicating that the test impedance matching network is included within a plasma tool or information indicating that the reference impedance matching network is included within the plasma tool is received;
applying in the plasma tool having the test impedance matching network the set of test characteristics to the impedance matching model to calculate one or more values of one or more parameters at the output of the impedance matching model upon determining that the information indicating that the test impedance matching network is included within the plasma tool is received; and
applying in the plasma tool the set of reference characteristics to the impedance matching model to calculate one or more values of the one or more parameters at the output of the impedance matching model upon determining that the information indicating that the reference impedance matching network is included within the plasma tool is received.

2. The method of claim 1, further comprising:
receiving another test impedance, wherein the other test impedance is measured for the frequency operating range and for the position range associated with one or more other test variable capacitors within another test impedance matching network coupled to the load, wherein the other test impedance matching network has the arrangement of the reference impedance matching network;
when the load impedance is applied at the output of the impedance matching model, generating another set of test characteristics of the pre-determined elements of the impedance matching model to achieve the other test impedance at the input of the impedance matching model; and
applying in another plasma tool the other set of test characteristics to the impedance matching model to calculate one or more values of the one or more parameters at the output of the impedance matching model, wherein the other plasma tool includes the other test impedance matching network.

3. The method of claim 1, wherein one of the reference characteristics of one of the pre-determined elements represents one or more characteristics of one or more circuit components within the reference impedance matching network, wherein one of the one or more characteristics of one of the one or more circuit components is associated with a parameter that changes in a direction in which the parameter associated with another one of the one or more characteristics of another one of the one or more circuit components changes.

4. The method of claim 1, further comprising applying in another plasma tool the impedance matching model having the set of reference characteristics to calculate one or more values of the one or more parameters at the output of the impedance matching model, wherein the other plasma tool includes the reference impedance matching network.

5. The method of claim 1, wherein the sensor is implemented within a network analyzer, wherein the impedance matching model is derived from a portion of the reference impedance matching network.

6. The method of claim 1, wherein the frequency operating range is associated with a frequency of operation of a radio frequency (RF) generator to be coupled to the reference impedance matching network.

7. The method of claim 1,
wherein the test characteristics include capacitances of the pre-determined elements, or inductances of the pre-determined elements, or an inductance of one of the pre-determined elements and a capacitance of another one of the pre-determined elements,
wherein the reference characteristics include capacitances of the pre-determined elements, or inductances of the pre-determined elements, or an inductance of one of the pre-determined elements and a capacitance of another one of the pre-determined elements.

8. The method of claim 1, wherein the reference impedance matching network has a different identification number than the test impedance matching network.

9. The method of claim 1, wherein one of the test characteristics of one of the pre-determined elements represents one or more characteristics of one or more capacitors within the reference impedance matching network, or represents one or more characteristics of one or more inductors within the reference impedance matching network.

10. The method of claim 1, wherein the reference impedance is measured when the sensor is implemented within a network analyzer that operates at a frequency within the frequency operating range and the test impedance is measured when the network analyzer operates at another frequency within the frequency operating range, wherein the reference impedance is associated with a minimum of multiple complex voltage coefficient magnitudes for different frequencies of the network analyzer and the test impedance is associated with a minimum of complex voltage coefficient magnitudes for different frequencies of the network analyzer.

11. The method of claim 1, wherein the reference impedance is measured when the sensor is implemented within a network analyzer that operates at a frequency within the frequency operating range and the test impedance is measured when the network analyzer operates at the frequency within the frequency operating range.

12. The method of claim 1, wherein the pre-determined elements are identified from a group of the pre-determined elements and additional pre-determined elements when a change in one of the reference characteristics of one of the pre-determined elements results in a change in a real part or an imaginary part of the reference impedance in a first direction and when a change in another one of the reference characteristics of another one of the pre-determined elements results in a change in a real part or an imaginary part of the reference impedance in a second direction, wherein the second direction is opposite to the first direction.

13. The method of claim 1, wherein the load is insensitive to changes in temperature, or pressure, or does not change during a pre-determined amount of time, wherein the plasma tool is sensitive to changes in temperature, or pressure, or changes during the pre-determined amount of time.

14. The method of claim 1, wherein the load includes one or more inductors, and one or more capacitors.

15. A method comprising:
receiving a reference impedance, wherein the reference impedance is measured for a frequency operating range of a sensor and for a position range associated with one or more reference variable capacitors within a reference impedance matching network that is coupled to a load, wherein the load has an output, wherein the output of the load is coupled to a resistor, wherein the load and the resistor have a combined impedance;
accessing an impedance matching model;
when the combined impedance is applied at an output of the impedance matching model, generating a set of reference characteristics of pre-determined elements of the impedance matching model to achieve the reference impedance at an input of the impedance matching model;
receiving a test impedance, wherein the test impedance is measured for the frequency operating range of the sensor and for the position range associated with one or more test variable capacitors within a test impedance matching network coupled to the load, wherein the reference impedance matching network has a same arrangement of circuit components as that of the test impedance matching network;
when the combined impedance is applied at the output of the impedance matching model, generating a set of test characteristics of the pre-determined elements of the impedance matching model to achieve the test impedance at the input of the impedance matching model;
determining whether information indicating that the test impedance matching network is included within a plasma tool or information indicating that the reference impedance matching network is included within the plasma tool is received;
applying in the plasma tool the set of test characteristics to the impedance matching model to calculate one or more values of one or more parameters at the output of the impedance matching model upon determining that the information indicating that the test impedance matching network is included within the plasma tool is received; and
applying in the plasma tool the set of reference characteristics to the impedance matching model to calculate one or more values of the one or more parameters at the output of the impedance matching model upon determining that the information indicating that the reference impedance matching network is included within the plasma tool is received.

16. The method of claim 15, wherein the characteristics of the set of reference characteristics include capacitances of the pre-determined elements, or inductances of the pre-determined elements, or an inductance of one of the pre-determined elements and a capacitance of another one of the pre-determined elements.

17. The method of claim 15, wherein the reference impedance is measured when the sensor is implemented within a network analyzer that operates at a frequency within the frequency operating range and the test impedance is measured when the network analyzer that operates at another frequency within the frequency operating range, wherein the reference impedance is associated with a minimum of multiple complex voltage reflection magnitudes for different frequencies of the network analyzer and the test impedance is associated with a minimum of multiple complex voltage reflection magnitudes for different frequencies of the network analyzer.

18. The method of claim 15, wherein the reference impedance is measured when the sensor is implemented within a network analyzer that operates at a frequency within the frequency operating range and the test impedance is measured when the network analyzer operates at the frequency within the frequency operating range.

19. The method of claim 15, wherein the load includes one or more inductors, and one or more capacitors, and one or more resistors, wherein the impedance matching model is derived from a portion of the reference impedance matching network.

20. A method comprising:
receiving a reference efficiency, wherein the reference efficiency is measured for a frequency operating range of a network analyzer and for a position range associated with one or more reference variable capacitors within a reference impedance matching network that is coupled to a load, wherein the load has an efficiency, wherein the reference efficiency is calculated from the efficiency of the load;
accessing an impedance matching model;
generating a set of reference characteristics of pre-determined elements of the impedance matching model to achieve the reference efficiency;

receiving a test efficiency, wherein the test efficiency is measured for the frequency operating range of the sensor and for the position range associated with one or more test variable capacitors within a test impedance matching network coupled to the load wherein the reference impedance matching network has a same arrangement of circuit components as that of the test impedance matching network;

generating a set of test characteristics of the pre-determined elements of the impedance matching model to achieve the test efficiency;

determining whether information indicating that the test impedance matching network is included within a plasma tool or information indicating that the reference impedance matching network is included within the plasma tool is received;

applying in the plasma tool the set of test characteristics to the impedance matching model to calculate one or more values of one or more parameters at the output of the impedance matching model upon determining that the information indicating that the test impedance matching network is included within the plasma tool is received; and applying in the plasma tool the set of reference characteristics to the impedance matching model to calculate one or more values of the one or more parameters at the output of the impedance matching model upon determining that the information indicating that the reference impedance matching network is included within the plasma tool is received.

21. The method of claim 20, wherein the characteristics of the set of reference characteristics include an inductance of one of the pre-determined elements and a capacitance of another one of the pre-determined elements and a resistance of yet another one of the pre-determined elements, or an inductance of one of the pre-determined elements and an inductance of another one of the pre-determined elements and a resistance of yet another one of the pre-determined elements, or a capacitance of one of the pre-determined elements and a capacitance of another one of the pre-determined elements and a resistance of yet another one of the pre-determined elements.

22. The method of claim 20, wherein the frequency operating range is associated with a frequency of operation of a radio frequency (RF) generator to be coupled to the reference impedance matching network.

23. The method of claim 20, wherein the reference efficiency is measured when the sensor is implemented within a network analyzer that operates at a frequency within the frequency operating range and the test efficiency is measured when the network analyzer operates at another frequency within the frequency operating range, wherein the reference efficiency is associated with a minimum of multiple complex voltage coefficient magnitudes for different frequencies of the network analyzer and the test efficiency is associated with a minimum of multiple complex voltage coefficient magnitudes for different frequencies of the network analyzer.

24. The method of claim 20, wherein the reference efficiency is measured when the sensor is implemented within a network analyzer that operates at a frequency within the frequency operating range and the test efficiency is measured when the network analyzer operates at the frequency within the frequency operating range.

25. The method of claim 20, wherein the load includes one or more inductors, and one or more capacitors, and one or more resistors, wherein the impedance matching model is derived from a part of the reference impedance matching network.

* * * * *